US012736330B2

(12) United States Patent
Takumi et al.

(10) Patent No.: US 12,736,330 B2
(45) Date of Patent: Sep. 15, 2026

(54) SOLID-STATE IMAGING DEVICE, SHAPE-MEASURING DEVICE, AND SHAPE-MEASURING METHOD

(71) Applicant: HAMAMATSU PHOTONICS K.K., Hamamatsu (JP)

(72) Inventors: Munenori Takumi, Hamamatsu (JP); Keisuke Uchida, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 101 days.

(21) Appl. No.: 18/716,620

(22) PCT Filed: Oct. 17, 2022

(86) PCT No.: PCT/JP2022/038601

§ 371 (c)(1),
(2) Date: Jun. 5, 2024

(87) PCT Pub. No.: WO2023/119816

PCT Pub. Date: Jun. 29, 2023

(65) Prior Publication Data

US 2025/0052562 A1 Feb. 13, 2025

(30) Foreign Application Priority Data

Dec. 21, 2021 (JP) ................................ 2021-206787

(51) Int. Cl.
*G01B 11/24* (2006.01)
*H10F 39/00* (2025.01)

(52) U.S. Cl.
CPC ......... *G01B 11/24* (2013.01); *H10F 39/8023* (2025.01); *H10F 39/8057* (2025.01)

(58) Field of Classification Search
CPC ..... G01B 11/24; G01B 11/00; H10F 39/8023; H10F 39/8057
See application file for complete search history.

(56) References Cited

U.S. PATENT DOCUMENTS 5,567,976 A 10/1996 Dierschke et al.
2020/0213551 A1* 7/2020 Takumi .................... G06T 7/66

FOREIGN PATENT DOCUMENTS

JP S61-140827 A 6/1986
JP H0334369 A * 2/1991

(Continued)

OTHER PUBLICATIONS

International Preliminary Report on Patentability mailed Jul. 4, 2024 for PCT/JP2022/038601.

*Primary Examiner* — Monica T Taba
(74) *Attorney, Agent, or Firm* — Faegre Drinker Biddle & Reath LLP

(57) ABSTRACT

A solid-state imaging device includes a first light receiving unit and second light receiving units. In the first light receiving unit, a plurality of pixel pairs are arrayed along an x direction. In each of the second light receiving units, a plurality of pixels each for generating charges in an amount according to a light receiving amount are arrayed along a y direction. Each pixel pair includes a first pixel and a second pixel. When line-shaped light extending in the x direction is incident on the first light receiving unit, as a light incident position varies from one side to another side in the y direction, a charge amount generated in the first pixel gradually decreases, and a charge amount generated in the second pixel gradually increases.

36 Claims, 22 Drawing Sheets

(56) References Cited

FOREIGN PATENT DOCUMENTS

| | | | |
|---|---|---|---|
| WO | WO-2019/058897 | A1 | 3/2019 |
| WO | WO-2019/059236 | A1 | 3/2019 |

* cited by examiner 5A
10
11
12
13
20A
20B
21
30
40A
40B
50
60
x
y
SECOND SIGNAL PROC- ESSING UNIT
SECOND SIGNAL PROC- ESSING UNIT
FIRST SIGNAL PROCESSING UNIT
STORAGE UNIT
OPERATION UNIT 5A
10
12
13
12
13
30
31
31
31
31
32
33
34
AMPLIFIER
ADC
SHIFT REGISTER 5B
40A
21
20A
11
12
13
10
SECOND SIGNAL PROC-ESSING UNIT
60
STORAGE UNIT
50
OPERATION UNIT
21
30
FIRST SIGNAL PROCESSING UNIT
y
x 5D
11
12
13
21
20A
20B
20C
10(10A)
10(10B)
x
y 5A
L
10
11
12
13
20A
20B
21
x
y 5A
L
20B
20A
21
11
12
13
10
x
y 5A
L
20B
20A
21
10
11
12
13
x
y 5D
L
21
11
12
13
20A
20B
20C
10(10A)
10(10B)
x
y 5A
10
11
12
13
20A
20B
21
Ls
x
y (a)
HEIGHT CONVERSION VALUE
0.8
0.7
0.6
0.5
0.4
0.3
0.2
0.1
0
35000
30000
25000
20000
15000
10000
5000
0
VALUE OF FIRST ELECTRICAL SIGNAL
HEIGHT CONVERSION VALUE
OUTPUT VALUE OF SECOND PIXEL 13
OUTPUT VALUE OF FIRST PIXEL 12
HEIGHT OF Z STAGE (mm)
(b)
0.015
0.01
0.005
0
-0.005
-0.01
-0.015
HEIGHT CONVERSION VALUE - TRUE HEIGHT
HEIGHT OF Z STAGE (mm)

(b)

11G 12G 14 13G 15

10 z x (a)

(b)

SOLID-STATE IMAGING DEVICE, SHAPE-MEASURING DEVICE, AND SHAPE-MEASURING METHOD

TECHNICAL FIELD

The present disclosure relates to a solid-state imaging device, a shape measurement apparatus, and a shape measurement method.

BACKGROUND ART

Patent Documents 1 and 2 disclose an invention of a solid-state imaging device including a light receiving unit in which first pixels and second pixels are alternately arrayed along a first direction. In one configuration example of the above solid-state imaging device, from one side to another side in a second direction intersecting with the above first direction, a width in the first direction of the first pixel gradually decreases, and a width in the first direction of the second pixel gradually increases. Further, it is also described in these documents that a shape of an object can be measured by a light section method by using the above solid-state imaging device.

In a shape measurement by using the light section method, a solid-state imaging device (area sensor) including a light receiving unit in which a plurality of pixels are arrayed two-dimensionally may be used. In this case, since the number of pixels is large, it takes a long time to read out a signal according to a light receiving amount in each pixel. On the other hand, in the shape measurement by using the light section method, when the solid-state imaging device described in Patent Documents 1 and 2 is used, the number of pixels is smaller than that of the area sensor, and thus, the time for reading out the signal from each pixel can be shortened, and the shape measurement can be performed with increased speed and higher resolution.

The solid-state imaging device described in Patent Documents 1 and 2 is the same as a linear sensor in that the plurality of pixels (the first pixels and the second pixels) are arrayed one-dimensionally in the light receiving unit, and thus, it is possible to shorten the time for reading out the signal from each pixel compared with the case of using the area sensor. Further, in the solid-state imaging device described in Patent Documents 1 and 2, each of the first pixel and the second pixel has a characteristic structure in the light receiving unit, and thus, at each position in the first direction in which the pixels are arrayed, it is possible to obtain a light incident position for the second direction intersecting with the first direction by calculation.

That is, the solid-state imaging device described in Patent Documents 1 and 2 can be used instead of the area sensor in the shape measurement by the light section method, and further, the shape measurement can be performed with increased speed and higher resolution compared with the case of using the area sensor.

CITATION LIST

Patent Literature

Patent Document 1: International Publication No. 2019/058897

Patent Document 2: International Publication No. 2019/059236

SUMMARY OF INVENTION

Technical Problem

In studying and developing the shape measurement technique by the light section method using the solid-state imaging device described in Patent Documents 1 and 2, the present inventors have found that the above solid-state imaging device has the following problem. That is, in the solid-state imaging device described in Patent Documents 1 and 2, the light incident position in the second direction intersecting with the first direction in the light receiving unit can be obtained by calculation, but a two-dimensional intensity distribution of incident light in the light receiving unit cannot be detected, and thus, it is not possible to determine whether an optical setting state is appropriate or not.

For example, light with which the object is irradiated by a light irradiation unit may be line-shaped light having a narrow width and extending in a predetermined direction. By an imaging optical system provided between the object and the solid-state imaging device, it is desirable that a light irradiation region in the object and the light receiving unit of the solid-state imaging device have a positional relationship optically conjugate to each other. Further, when the object is flat in the shape measurement by using the light section method, reflected light incident on the light receiving unit of the solid-state imaging device from the object through the imaging optical system may be a line-shaped light which is parallel to the first direction in the light receiving unit. In order to realize the above features, it is necessary that the optical setting state is appropriate.

However, evaluation of the optical setting state is possible in the case in which the area sensor capable of detecting the two-dimensional intensity distribution of the incident light in the light receiving unit is used, but it is difficult in the case in which the solid-state imaging device described in Patent Documents 1 and 2 is used. When the shape of the object is measured by the light section method when the optical setting state is not appropriate, accuracy of the output signal from the solid-state imaging device may be degraded, and accuracy of the shape measurement may also be degraded. Further, it is difficult to evaluate the optical setting state, and therefore, it is also difficult to adjust and optimize the optical setting state.

An object of an embodiment is to provide a solid-state imaging device capable of performing evaluation and adjustment of an optical setting state when used for a shape measurement by a light section method. Further, an object of an embodiment is to provide an apparatus and a method capable of measuring a shape of an object at high speed and high resolution by the light section method using the solid-state imaging device described above.

Solution to Problem

An embodiment is a solid-state imaging device. The solid-state imaging device includes a first light receiving unit in which a plurality of pixel pairs are arrayed along a first direction; and a second light receiving unit in which a plurality of pixels each for generating charges in an amount according to a light receiving amount are arrayed along a second direction intersecting with the first direction, and each of the plurality of pixel pairs of the first light receiving unit includes a first pixel and a second pixel arranged in juxtaposition along the first direction, and when line-shaped light extending in the first direction is incident on the first light receiving unit, as a light incident position varies from one side to another side in the second direction, a charge amount generated in the first pixel gradually decreases, and a charge amount generated in the second pixel gradually increases.

An embodiment is a shape measurement apparatus. The shape measurement apparatus is an apparatus for measuring a shape of an object by a light section method, and includes a light irradiation unit for irradiating each position on a predetermined line on the object with light; an imaging optical system for inputting and forming an image of reflected light generated by light irradiation on the object by the light irradiation unit; and the solid-state imaging device of the above configuration for receiving the reflected light through the imaging optical system, and the operation unit of the solid-state imaging device measures the shape of the object by obtaining the light incident position in the second direction at each position in the first direction in the first light receiving unit based on the first electrical signal output from the signal processing unit of the solid-state imaging device, and evaluates an optical setting state of the light irradiation unit, the imaging optical system, or the solid-state imaging device by obtaining the light incident intensity distribution in the second direction in the second light receiving unit based on the second electrical signal output from the signal processing unit of the solid-state imaging device.

An embodiment is a shape measurement method. The shape measurement method is a method for measuring a shape of an object by a light section method using a light irradiation unit for irradiating each position on a predetermined line on the object with light; an imaging optical system for inputting and forming an image of reflected light generated by light irradiation on the object by the light irradiation unit; and the solid-state imaging device of the above configuration for receiving the reflected light through the imaging optical system, and includes a measurement step of measuring the shape of the object by obtaining the light incident position in the second direction at each position in the first direction in the first light receiving unit based on the first electrical signal output from the signal processing unit of the solid-state imaging device; and an evaluation step of evaluating an optical setting state of the light irradiation unit, the imaging optical system, or the solid-state imaging device by obtaining the light incident intensity distribution in the second direction in the second light receiving unit based on the second electrical signal output from the signal processing unit of the solid-state imaging device.

An embodiment is a correction method. The correction method includes causing light to be incident on each position on a predetermined line extending in the first direction for the solid-state imaging device of the above configuration at each position in the second direction; and correcting the light incident position in the second direction obtained based on the first electrical signal based on a comparison between the light incident positions in the second direction respectively obtained based on the first electrical signal and the second electrical signal output from the signal processing unit of the solid-state imaging device.

Advantageous Effects of Invention

According to the embodiments, it is possible to provide a solid-state imaging device capable of performing evaluation and adjustment of an optical setting state when used for a shape measurement by a light section method.

DESCRIPTION OF EMBODIMENTS

Hereinafter, embodiments of a solid-state imaging device, a shape measurement apparatus, and a shape measurement method will be described in detail with reference to the accompanying drawings. In the description of the drawings, the same elements will be denoted by the same reference signs, and redundant description will be omitted. The present invention is not limited to these examples, and the Claims, their equivalents, and all the changes within the scope are intended as would fall within the scope of the present invention.

Figure 1:
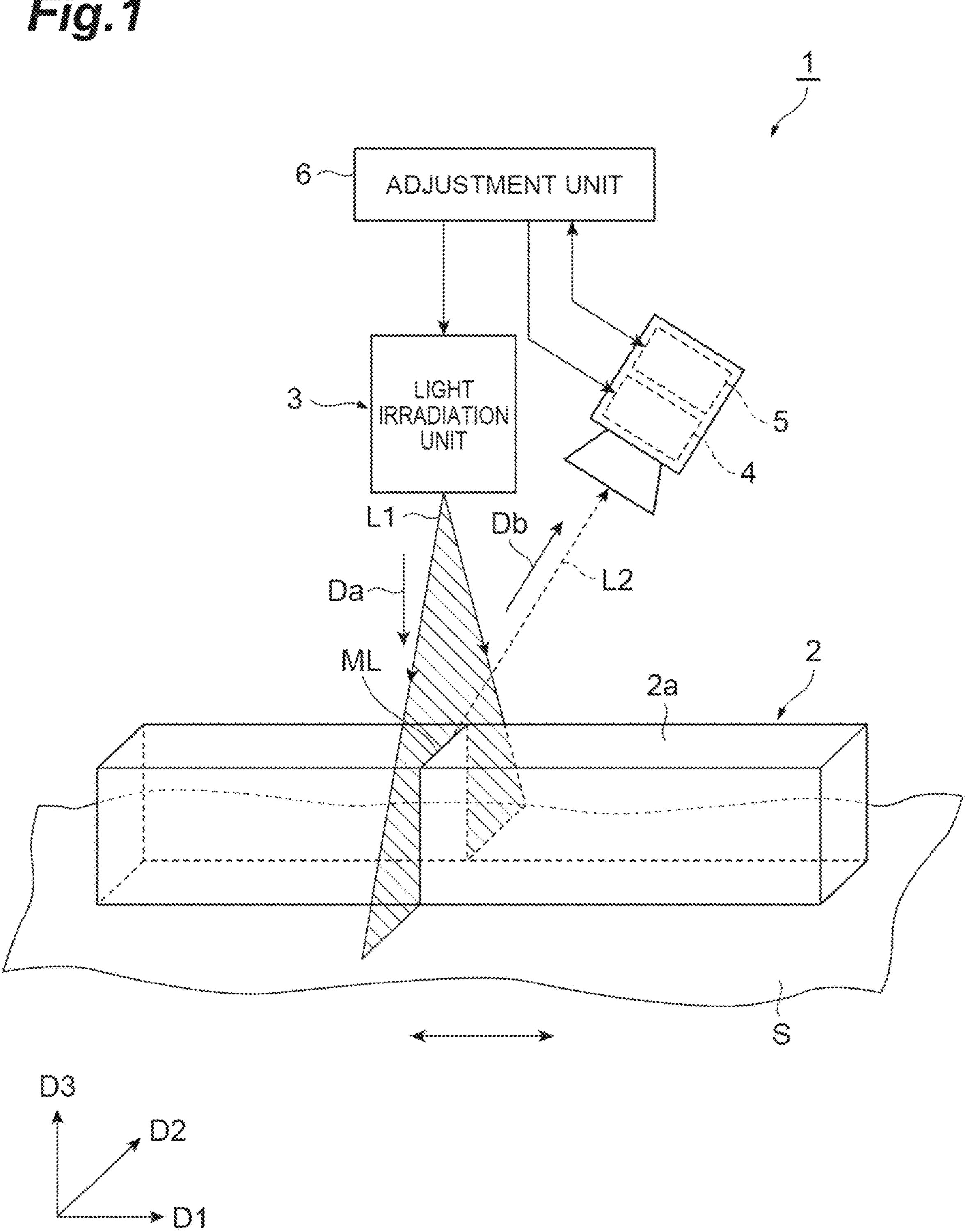
FIG. 1 is a diagram illustrating a configuration of a shape measurement apparatus 1.

FIG. 1 is a diagram illustrating a configuration of a shape measurement apparatus 1. The shape measurement apparatus 1 is an apparatus for measuring a surface shape of an object 2 by using the light section method, and includes a light irradiation unit 3, an imaging optical system 4, a solid-state imaging device 5, and an adjustment unit 6. The imaging optical system 4 and the solid-state imaging device 5 constitute an imaging camera for capturing an image of the surface of the object 2.

The object 2 is placed on a placement surface S of a moving stage moving in a direction D1, and moves in the direction D1 along with the movement of the moving stage. A moving speed of the above is, for example, 1 m/s. The placement surface S is a surface parallel to both the direction D1 and a direction D2. The direction D2 is a direction intersecting with (for example, perpendicular to) the direction D1. In this diagram, the object 2 has a rectangular parallelepiped appearance in which the direction D1 is a longitudinal direction, but is not limited thereto.

The light irradiation unit 3 irradiates each position on a predetermined line on the surface 2*a* of the object 2 with light. The light irradiation unit 3 includes a light source, and an irradiation optical system. The light irradiation unit 3 preferably outputs laser light. The light irradiation unit 3 is disposed at a position facing the surface 2*a* of the object 2 in a direction D3 intersecting with (for example, perpendicular to) both the direction D1 and the direction D2.

The light irradiation unit 3 may irradiate the object with line-shaped light extending along the direction D2. In this case, the light irradiation unit 3 includes, for example, the light source for outputting the light L1, and a cylindrical lens as the irradiation optical system for focusing the light L1 output from the light source and irradiating a line-shaped region ML with the light L1. The light L1 travels along the direction D3, passes through the cylindrical lens, and then, the respective positions on the line-shaped region ML on the surface 2*a* of the object 2 are simultaneously irradiated with the light L1 in the state of being spread in the direction D2.

Further, the light irradiation unit 3 may scan spot-shaped light along the line-shaped region ML. In this case, the light irradiation unit 3 includes, for example, the light source for outputting the light, and a scanning unit for scanning the line-shaped region ML with the light output from the light source.

The imaging optical system 4 inputs and forms an image of reflected light L2 generated by irradiation of the light L1 on the object 2 by the light irradiation unit 3. The solid-state imaging device 5 receives the reflected light L2 passed through the imaging optical system 4. The imaging optical system 4 and the solid-state imaging device 5 constitute the imaging camera for inputting the reflected light L2 generated by the irradiation of the light L1 onto the object 2 by the light irradiation unit 3 and capturing the image of the surface of the object 2. The imaging camera is provided in an inclined direction Db which is inclined from the line-shaped region ML as a starting point with respect to an irradiation direction Da of the light L1 to the line-shaped region ML.

For each position along the direction D1, the solid-state imaging device 5 sequentially images the reflected light L2 generated in the line-shaped region ML on the surface 2*a* of the object 2 at a predetermined frame rate, and outputs an electrical signal including a data sequence acquired by the imaging. The solid-state imaging device 5 includes a light receiving unit into which the reflected light L2 generated in the line-shaped region ML is input, and a signal processing unit for processing a signal output from the light receiving unit in response to incidence of the reflected light L2.

The object 2 relatively moves along the direction D1 with respect to the light irradiation unit 3 and the imaging camera along with the movement of the moving stage in the direction D1. As a result, for each position along the direction D1, the irradiation of the light L1 on the line-shaped region ML by the light irradiation unit 3 and the imaging of the line-shaped region ML based on the reflected light L2 by the solid-state imaging device 5 are sequentially performed. Thus, the three-dimensional shape of the surface 2*a* of the object 2 can be measured.

The adjustment unit 6 adjusts an optical setting state of the light irradiation unit 3, the imaging optical system 4, or the solid-state imaging device 5 based on the signal output from the solid-state imaging device 5. The adjustment unit 6 may be, for example, a computer including a processing unit such as a CPU or the like, and a storage unit such as a RAM, an HDD, an SSD, or the like. The details of the adjustment will be described later.

Figure 2:
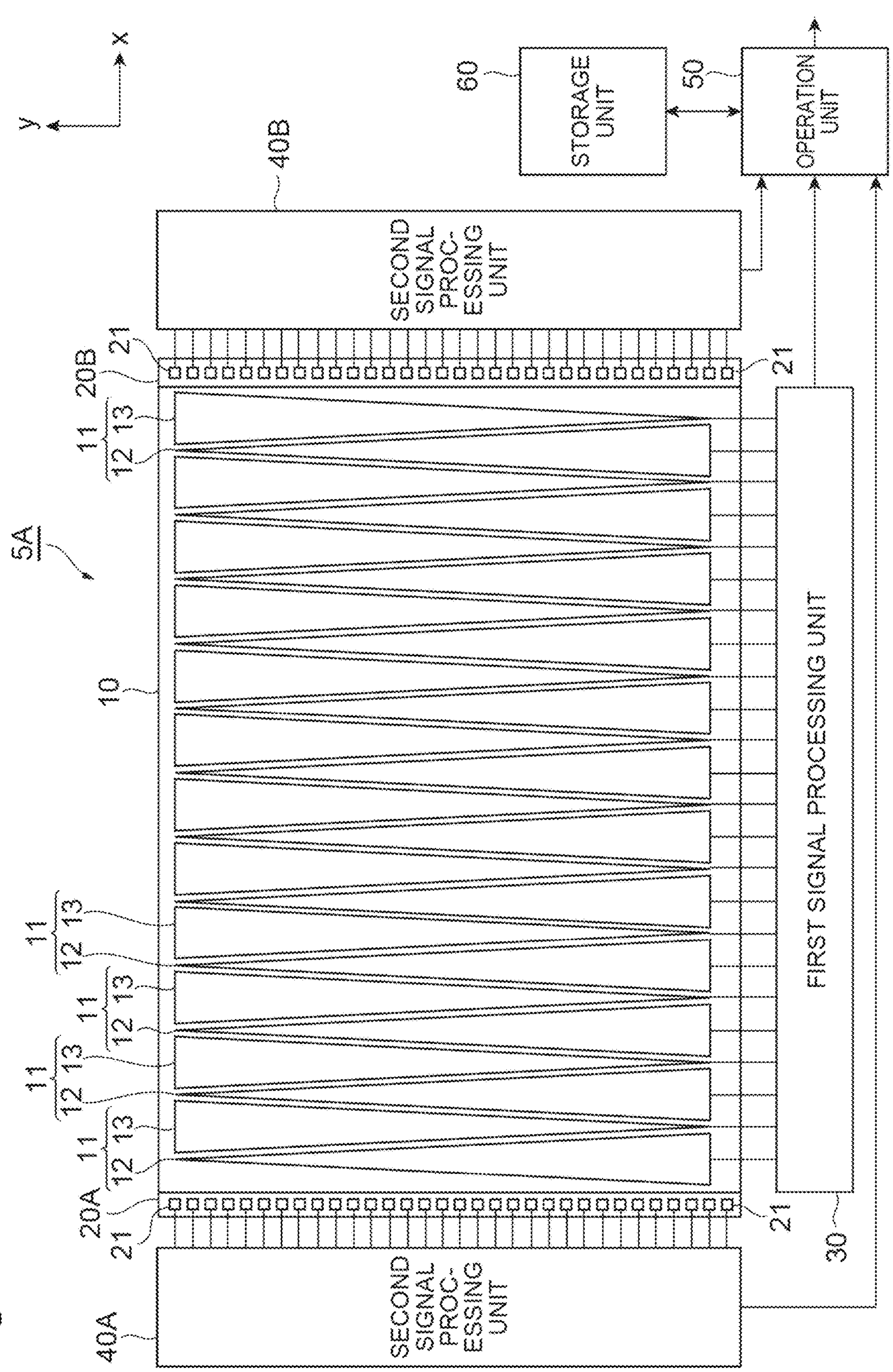
FIG. 2 is a diagram illustrating a first configuration example of a solid-state imaging device 5.

FIG. 2 is a diagram illustrating a first configuration example of the solid-state imaging device 5. A solid-state imaging device 5A of the first configuration example illustrated in this diagram includes a first light receiving unit 10, second light receiving units 20A and 20B, a first signal processing unit 30, second signal processing units 40A and 40B, an operation unit 50, and a storage unit 60.

These units may be formed on a single semiconductor substrate. Further, the first light receiving unit 10 and the second light receiving units 20A and 20B may be formed on one semiconductor substrate, and the first signal processing unit 30, the second signal processing units 40A and 40B, the operation unit 50, and the storage unit 60 may be formed on another semiconductor substrate. In this case, these two semiconductor substrates may be electrically connected by a bump. The operation unit 50 and the storage unit 60 may be a computer, or an embedded system including a microcomputer, an FPGA, or the like.

In the first light receiving unit 10, a plurality of pixel pairs 11 are arrayed along a first direction (x direction). In each of the second light receiving units 20A and 20B, a plurality of pixels 21 each for generating charges in an amount according to a light receiving amount are arrayed along a second direction intersecting with the first direction. The second direction may be a y direction orthogonal to the x direction.

Each of the plurality of pixel pairs 11 of the first light receiving unit 10 includes a first pixel 12 and a second pixel 13. When the line-shaped light extending in the x direction is incident on the first light receiving unit 10, as the light incident position varies from one side to another side in the y direction, an amount of charges generated in the first pixel 12 gradually decreases, and an amount of charges generated in the second pixel 13 gradually increases.

The first pixel 12 and the second pixel 13 having the relationship between the light incident position in the y direction and the charge generation amount described above may have various types of configurations, and further, the configuration illustrated in this diagram is characterized by the shape of each pixel. That is, the shape of the first pixel 12 is a triangular shape in which the width in the x direction gradually decreases from the one side to the other side in the y direction. The shape of the second pixel 13 is a triangular shape in which the width in the x direction gradually increases from the one side to the other side in the y direction.

For example, the above triangular shape is an isosceles triangular shape, a width of a base is about 10 μm, and a height is about several mm. The width in the x direction of each of the first pixel 12 and the second pixel 13 is a width in the x direction of a region (photosensitive region) capable of generating the charges in response to the light incidence in each of the pixels.

The second light receiving unit 20A is provided on one side in the x direction with respect to the first light receiving unit 10. The second light receiving unit 20B is provided on the other side in the x direction with respect to the first light receiving unit 10. The number of pixels 21 included in the second light receiving unit 20A and the number of pixels 21 included in the second light receiving unit 20B are preferably the same, and the pixels are preferably provided at the same positions in the y direction. The pixels 21 included in each of the second light receiving unit 20A and the second light receiving unit 20B may have the same configuration.

The first signal processing unit 30 is electrically connected to each of the first pixel 12 and the second pixel 13 of the plurality of pixel pairs 11 of the first light receiving unit 10, and outputs a first electrical signal of a data sequence according to the charge amount generated in each of the first pixel 12 and the second pixel 13.

The second signal processing unit 40A is electrically connected to each of the plurality of pixels 21 of the second light receiving unit 20A, and outputs a second electrical signal of a data sequence according to the charge amount generated in each of the pixels 21. The second signal processing unit 40B is electrically connected to each of the plurality of pixels 21 of the second light receiving unit 20B, and outputs a second electrical signal of a data sequence according to the charge amount generated in each of the pixels 21.

The operation unit 50 is electrically connected to the first signal processing unit 30. The operation unit 50 obtains the light incident position in the y direction at each position in the x direction in the first light receiving unit 10 based on the first electrical signal output from the first signal processing unit 30, and measures the shape of the object 2 (measurement step).

Specifically, the operation unit 50 may obtain, for each of the plurality of pixel pairs 11 (that is, for each position in the x direction in the first light receiving unit 10), the data D12 of the first pixel 12 and the data D13 of the second pixel 13 based on the first electrical signal, and obtain the light incident position in the y direction based on a ratio of the two data D12 and D13.

The operation unit 50 is electrically connected also to the second signal processing units 40A and 40B. The operation unit 50 obtains the light incident intensity distribution in the y direction in the second light receiving unit 20A based on the second electrical signal output from the second signal processing unit 40A, and evaluates the optical setting state of the light irradiation unit 3, the imaging optical system 4, or the solid-state imaging device 5 (evaluation step). The operation unit 50 obtains the light incident intensity distribution in the y direction in the second light receiving unit 20B based on the second electrical signal output from the second signal processing unit 40B. The light incident intensity distribution contains information on a light intensity peak position and information on a width (for example, a full width at half maximum) of the distribution.

The storage unit 60 is preferably provided. The storage unit 60 stores a correction formula for correcting the light incident position in the y direction obtained based on the first electrical signal. In the case in which the storage unit 60 is provided, the operation unit 50 performs correction based on the correction formula stored in the storage unit 60 when obtaining the light incident position in the y direction at each position in the x direction in the first light receiving unit 10 based on the first electrical signal. The details of the correction will be described later.

Figure 3:
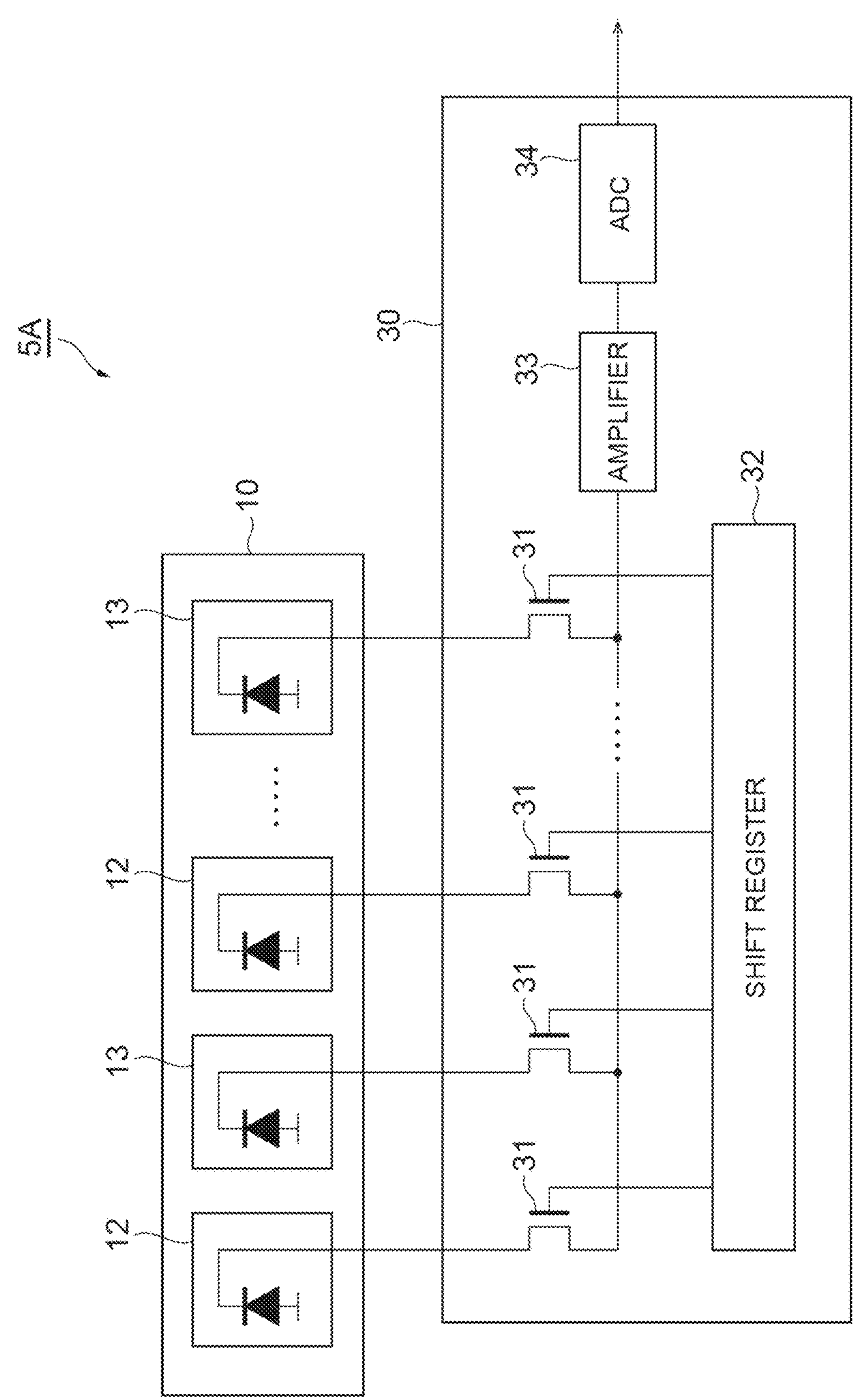
FIG. 3 is a diagram illustrating a circuit configuration example of a first signal processing unit 30.

FIG. 3 is a diagram illustrating a circuit configuration example of the first signal processing unit 30. In this diagram, each of the first pixel 12 and the second pixel 13 is indicated by using a circuit symbol of a photodiode. The first signal processing unit 30 includes NMOS transistors 31 of the same number as the total number of the first pixels 12 and the second pixels 13, a shift register 32, a charge amplifier 33, and an AD converter circuit 34.

Each of the first pixel 12 and the second pixel 13 is electrically connected to an input terminal of the charge amplifier 33 via the corresponding NMOS transistor 31. The NMOS transistor 31 is used as a switch, and is set to any one of an ON state and an OFF state according to a value of a control signal output from the shift register 32 and applied to a gate. The shift register 32 applies the control signal to the gate of each of the plurality of NMOS transistors 31 to sequentially set the plurality of NMOS transistors 31 to the ON state.

The charge amplifier 33 inputs the charges from the first pixel 12 or the second pixel 13 via the NMOS transistor 31, and inputs a voltage value according to the charge amount. The AD converter circuit 34 is electrically connected to the charge amplifier 33. The AD converter circuit 34 inputs the voltage value (analog value) output from the charge amplifier 33, and outputs a digital value according to the voltage value.

When the plurality of NMOS transistors 31 are sequentially set to the ON state one by one, the charges generated in response to the light receiving in the first pixel 12 or the second pixel 13 connected to the NMOS transistor 31 set to the ON state are input to the charge amplifier 33. Further, the voltage value according to the charge amount is output from the charge amplifier 33, and further, the digital value according to the voltage value output from the charge amplifier 33 is output from the AD converter circuit 34.

In the case in which the plurality of NMOS transistors 31 are sequentially set to the ON state one by one, the first electrical signal of the data sequence according to the charge amount generated in each of the first pixel 12 and the second pixel 13 of each of the plurality of pixel pairs 11 is output from the AD converter circuit 34.

The second signal processing units 40A and 40B may have the same configuration as that of the first signal processing unit 30. The second signal processing units 40A and 40B may output the signals in a common period. In this case, the shift register may be provided in common in the second signal processing units 40A and 40B.

The first signal processing unit 30 and the second signal processing units 40A and 40B may output the signals in a common period. In this case, the shift register may be provided in common in the first signal processing unit 30 and the second signal processing units 40A and 40B.

The first signal processing unit 30 and the second signal processing units 40A and 40B may output the signals in periods different from each other. In this case, the first signal processing unit 30 and the second signal processing units 40A and 40B may be provided separately, or the output of the first signal and the output of the second signal may be performed in the periods different from each other by a common signal processing unit.

The signal processing unit illustrated in FIG. 3 has a configuration of a passive pixel sensor (PPS), and further, the signal processing unit may have a configuration of an active pixel sensor (APS). Further, the signal processing unit illustrated in FIG. 3 has a configuration of a rolling shutter method in which the signals of the respective pixels are sequentially read out, and further, the signal processing unit may have a configuration of a global shutter method in which the signals of the respective pixels are simultaneously read out.

Next, other configuration examples of the solid-state imaging device 5 will be described with reference to FIG. 4 to FIG. 6.

Figure 4:
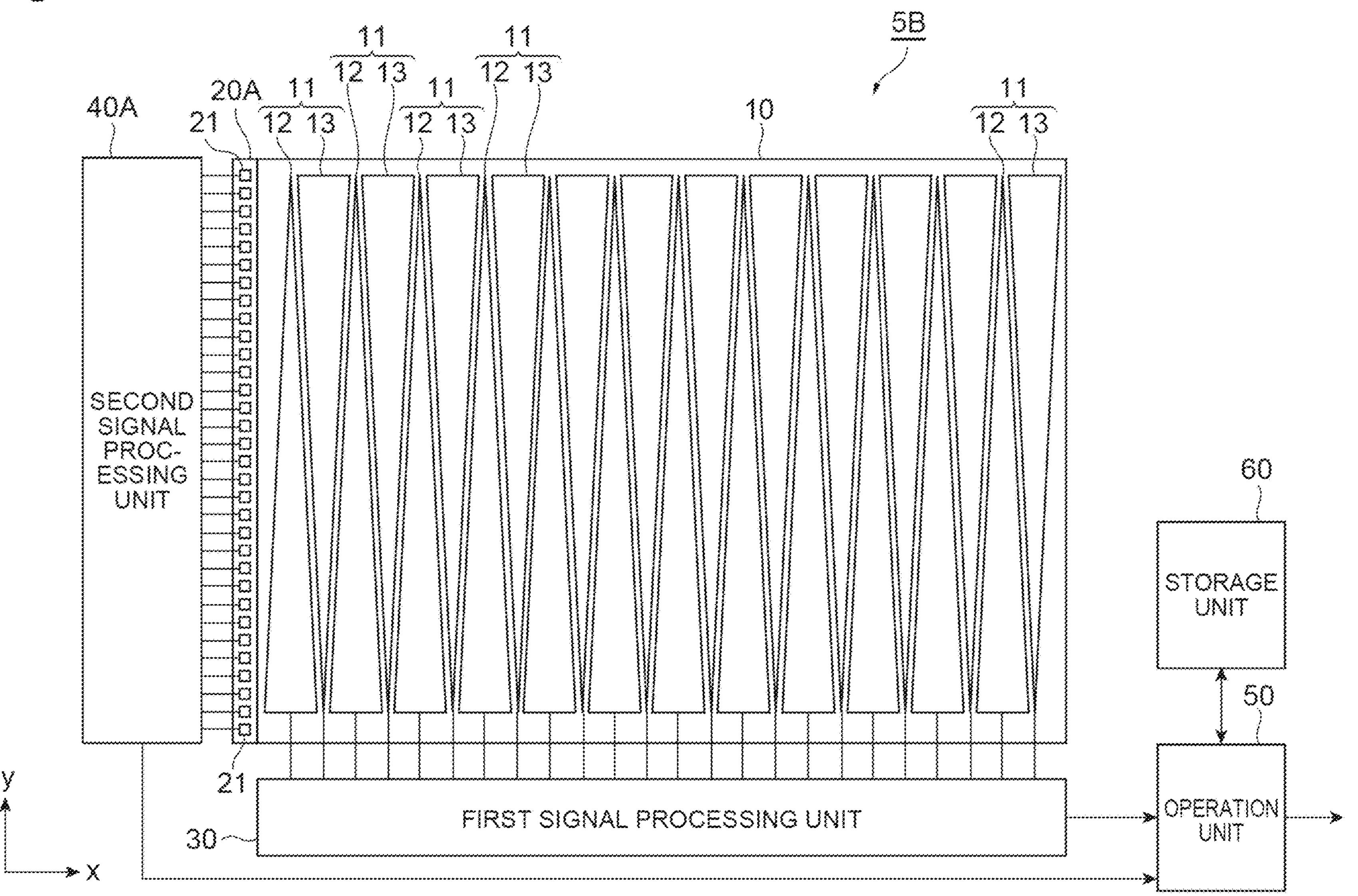
FIG. 4 is a diagram illustrating a second configuration example of the solid-state imaging device 5.

FIG. 4 is a diagram illustrating a second configuration example of the solid-state imaging device 5. A solid-state imaging device 5B of the second configuration example illustrated in this diagram includes the first light receiving unit 10, the second light receiving unit 20A, the first signal processing unit 30, the second signal processing unit 40A, the operation unit 50, and the storage unit 60.

In the solid-state imaging device 5A of the first configuration example (FIG. 2), the second light receiving unit 20A is provided on the one side in the x direction with respect to the first light receiving unit 10, and the second light receiving unit 20B is provided on the other side, and on the other hand, in the solid-state imaging device 5B of the second configuration example (FIG. 4), the second light receiving unit 20A is provided only on the one side in the x direction with respect to the first light receiving unit 10.

Figure 5:
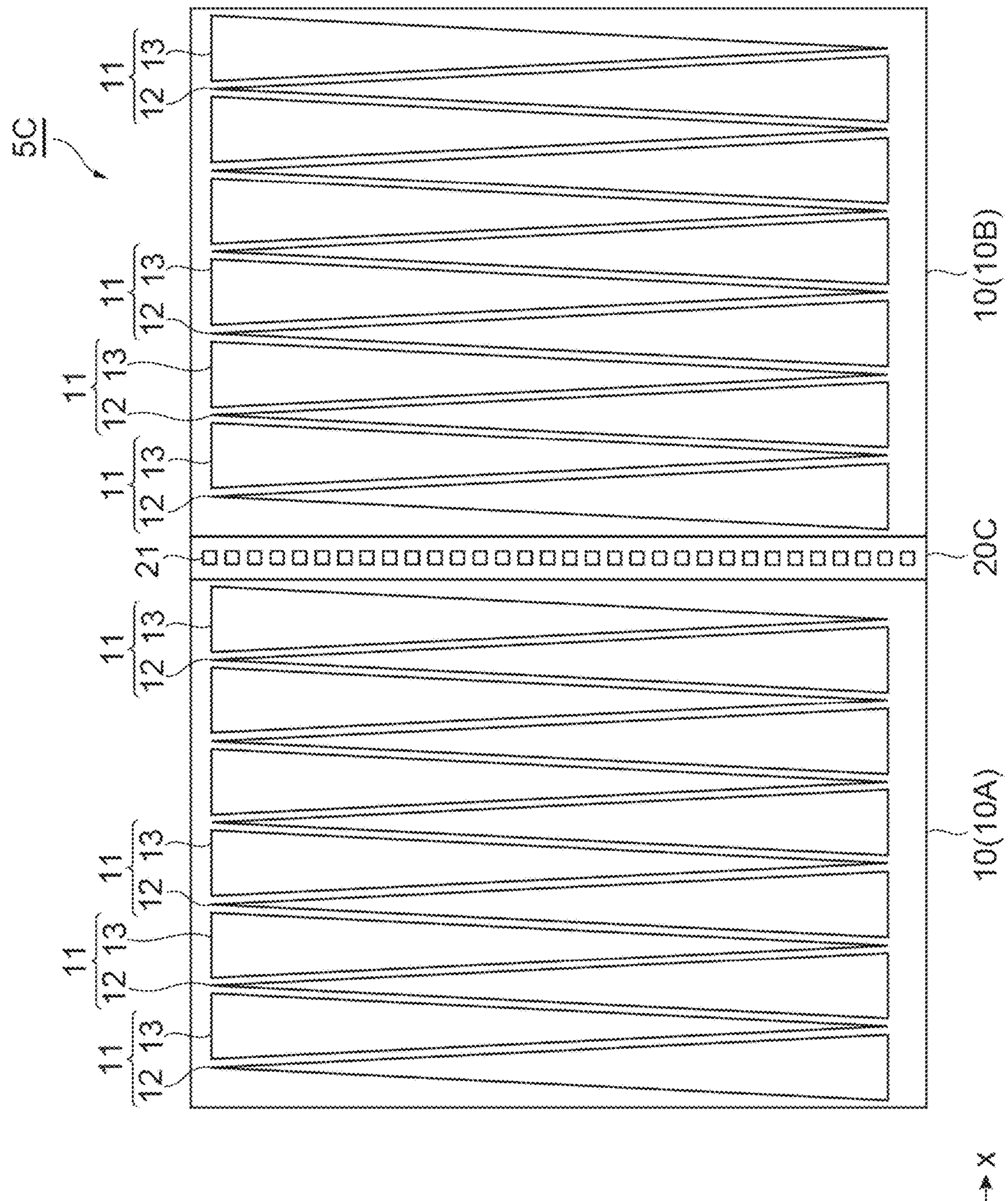
FIG. 5 is a diagram illustrating a third configuration example of the solid-state imaging device 5.

FIG. 5 is a diagram illustrating a third configuration example of the solid-state imaging device 5. A solid-state imaging device 5C of the third configuration example illustrated in this diagram includes the first light receiving unit 10 and a second light receiving unit 20C, and in addition, includes the signal processing unit, the operation unit, and the storage unit. In addition, the signal processing unit, the operation unit, and the storage unit are not illustrated in the diagram.

In the solid-state imaging device 5C of the third configuration example, the first light receiving unit 10 is divided into a first region 10A of the one side and a second region 10B of the other side in the x direction, and further, the second light receiving unit 20C is provided between the first region 10A and the second region 10B. The second light receiving unit 20C has the same configuration as that of the second light receiving units 20A and 20B of the solid-state imaging device 5A of the first configuration example (FIG. 2).

Figure 6:
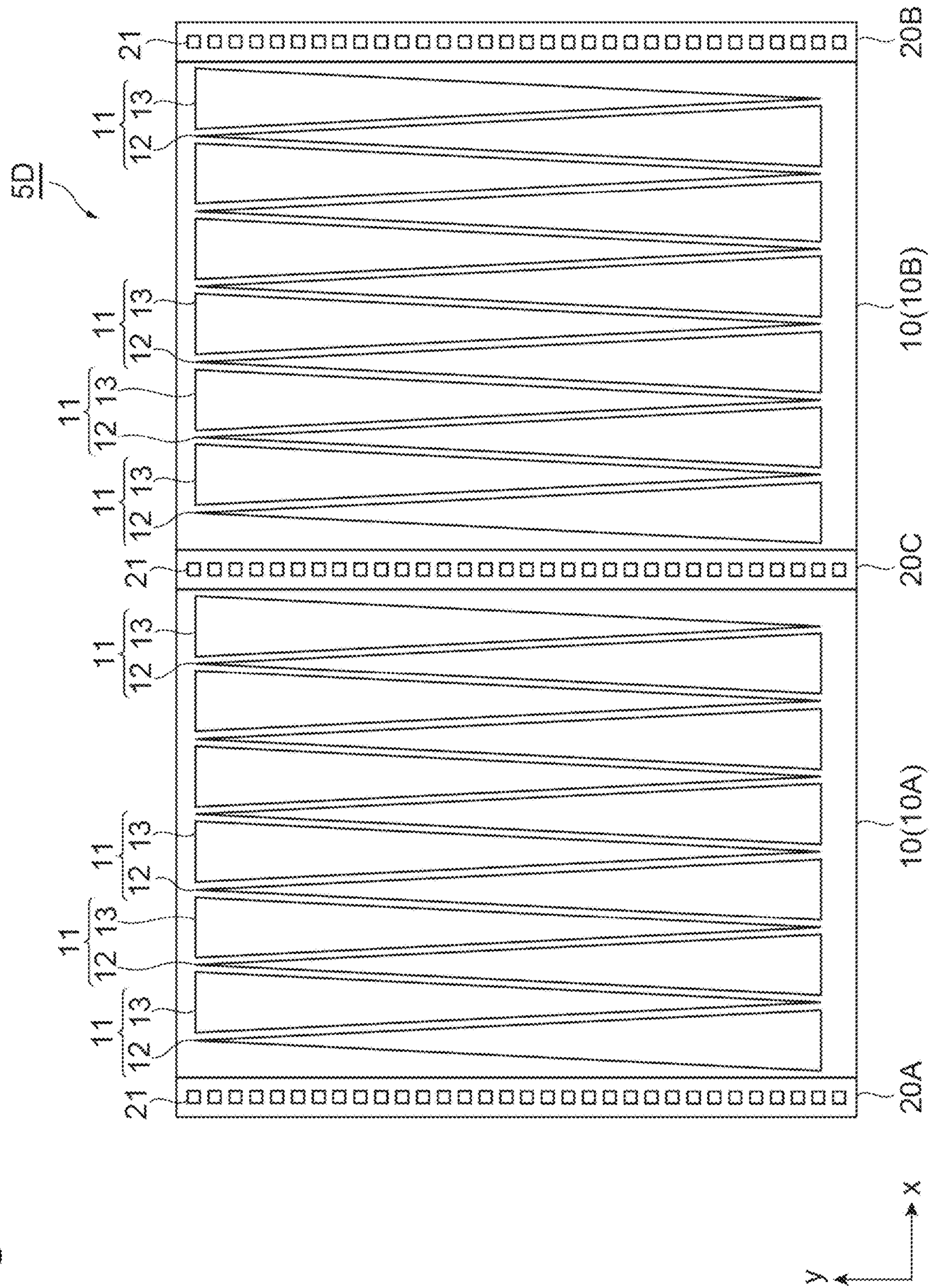
FIG. 6 is a diagram illustrating a fourth configuration example of the solid-state imaging device 5.

FIG. 6 is a diagram illustrating a fourth configuration example of the solid-state imaging device 5. A solid-state imaging device 5D of the fourth configuration example illustrated in this diagram includes the first light receiving unit 10 and the second light receiving units 20A, 20B, and 20C, and in addition, includes the signal processing unit, the operation unit, and the storage unit. In addition, the signal processing unit, the operation unit, and the storage unit are not illustrated in the diagram.

In the solid-state imaging device 5D of the fourth configuration example, the second light receiving unit 20A is provided on the one side in the x direction with respect to the first light receiving unit 10, and the second light receiving unit 20B is provided on the other side. Further, the first light receiving unit 10 is divided into the first region 10A of the one side and the second region 10B of the other side in the x direction, and further, the second light receiving unit 20C is provided between the first region 10A and the second region 10B.

In addition, in each of the solid-state imaging device 5C of the third configuration example (FIG. 5) and the solid-state imaging device 5D of the fourth configuration example (FIG. 6), a width in the x direction of each pixel 21 of the second light receiving unit 20C provided between the first region 10A and the second region 10B of the first light receiving unit 10 may be set to several μm. A shift register for reading out the charges in the second light receiving unit 20C may be provided on any one side in the x direction with respect to the first light receiving unit 10. Thus, a gap between the first region 10A and the second region 10B of the first light receiving unit 10 may be narrowed to a degree which does not cause a significant problem at the time of the shape measurement by using the light section method.

Further, it may have a configuration in which the light incident on the first light receiving unit 10, the second light receiving unit 20C, and the like is incident from a rear surface opposite to a front surface of the semiconductor substrate on which these are formed. In this case, a wiring line between each pixel 21 of the second light receiving unit 20C and the shift register does not block the light incidence.

It may have a configuration in which the first light receiving unit 10, the second light receiving unit 20C and the like are formed on one semiconductor substrate, the signal processing unit and the like are formed on another semiconductor substrate, and these two semiconductor substrates are electrically connected by bumps. In this case also, a gap between the first region 10A and the second region 10B of the first light receiving unit 10 may be narrowed, and further, a wiring line between each pixel 21 of the second light receiving unit 20C and the shift register may not block the light incidence.

Figure 7:
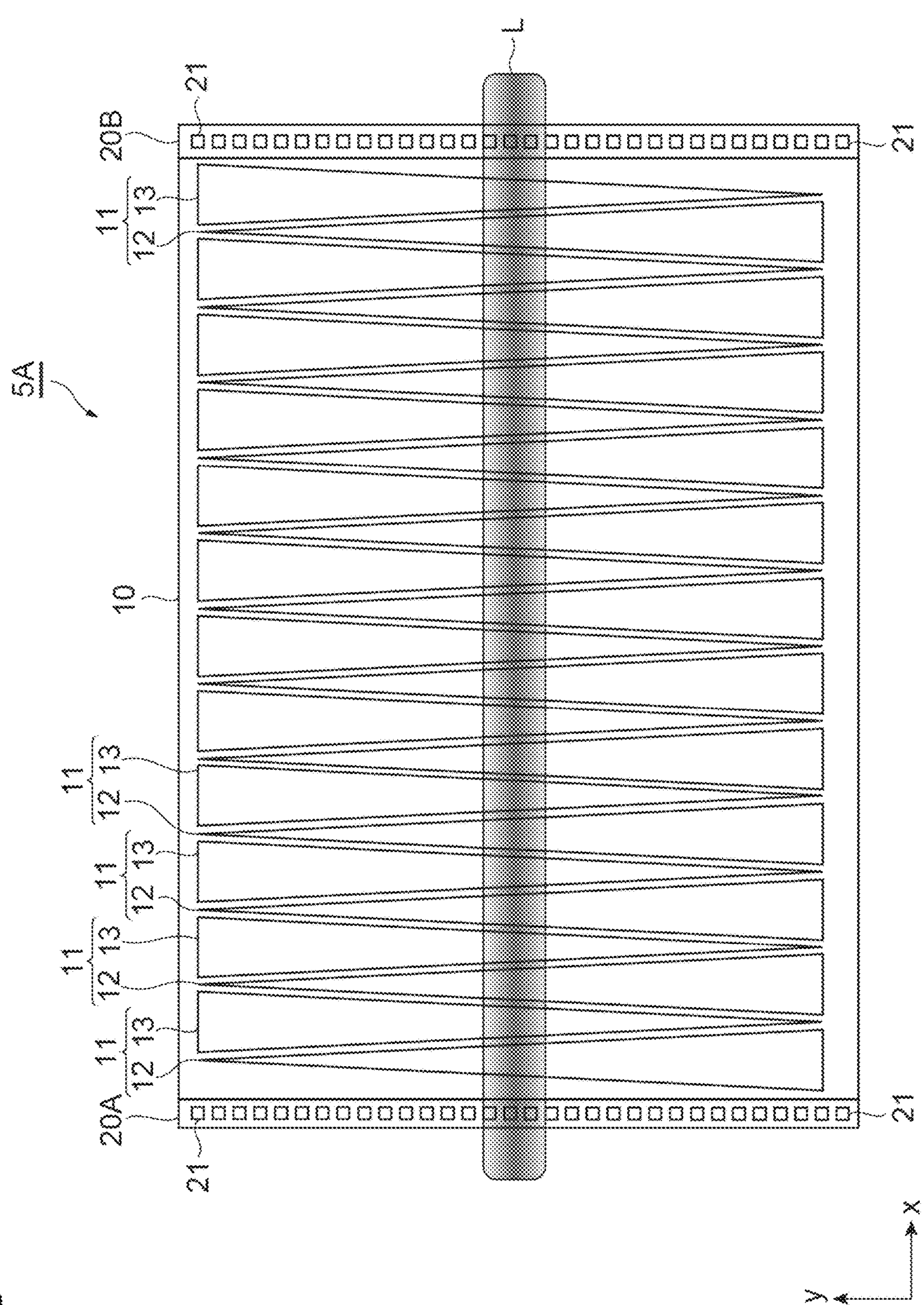
FIG. 7 is a diagram illustrating an example of an intensity distribution of line-shaped light, in grayscale, incident on a first light receiving unit 10 and the like of a solid-state imaging device 5A (FIG. 2) of the first configuration example.
Figure 8:
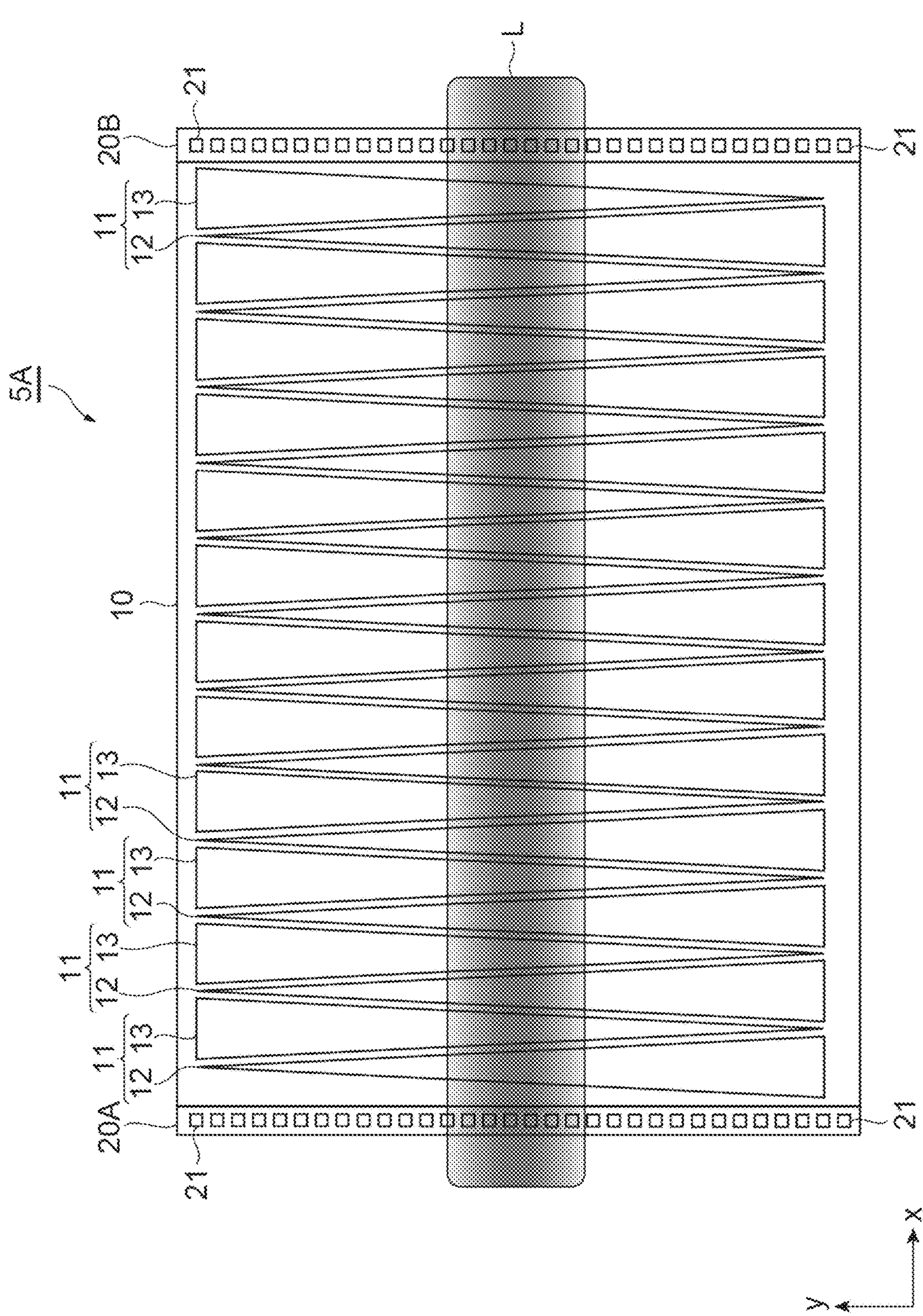
FIG. 8 is a diagram illustrating an example of the intensity distribution of the line-shaped light, in grayscale, incident on the first light receiving unit 10 and the like of the solid-state imaging device 5A (FIG. 2) of the first configuration example.
Figure 9:
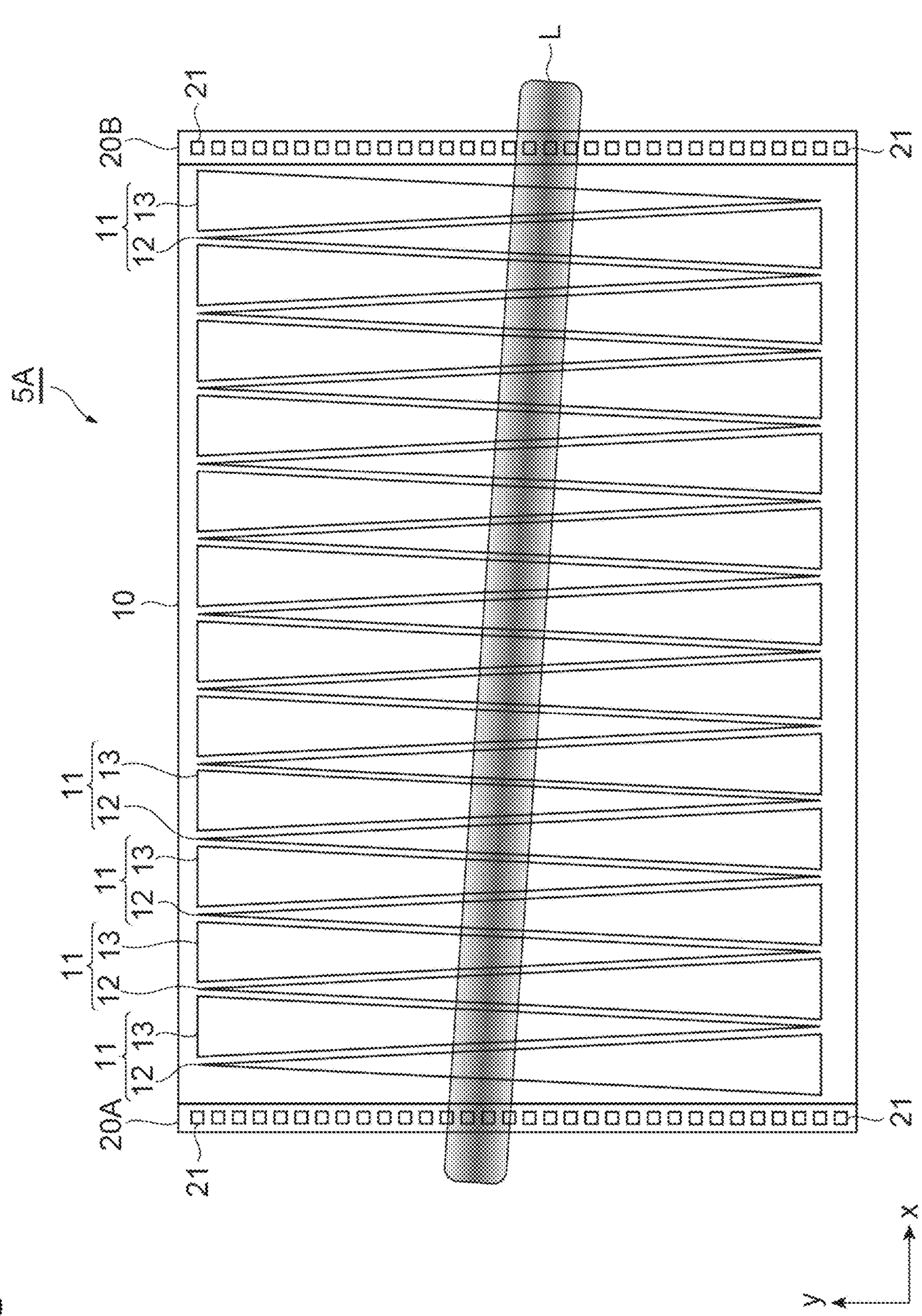
FIG. 9 is a diagram illustrating an example of the intensity distribution of the line-shaped light, in grayscale, incident on the first light receiving unit 10 and the like of the solid-state imaging device 5A (FIG. 2) of the first configuration example.
Figure 10:
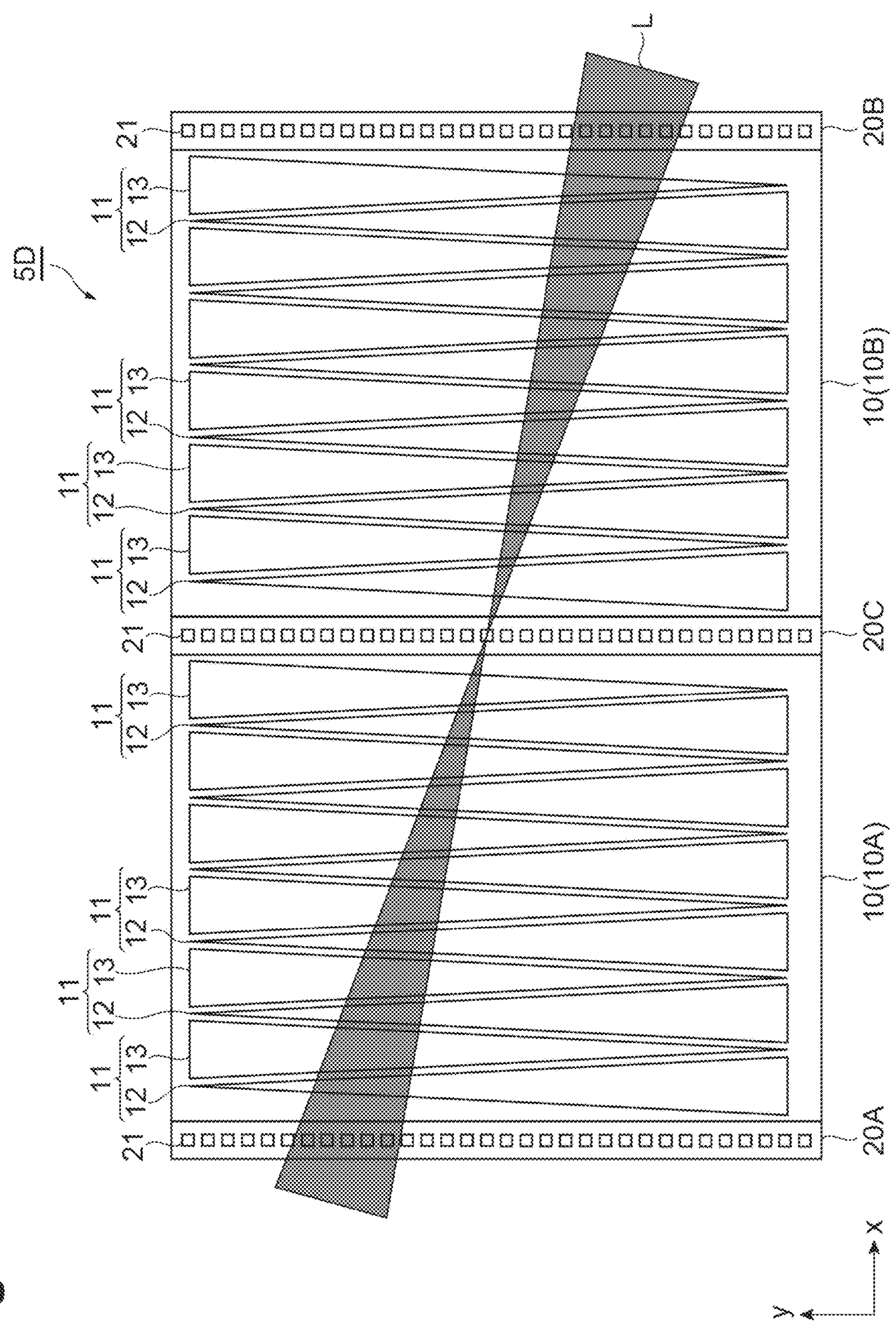
FIG. 10 is a diagram illustrating an example of the intensity distribution of the line-shaped light, in grayscale, incident on the first light receiving unit 10 and the like of a solid-state imaging device 5D (FIG. 6) of the fourth configuration example.

Next, the function and effect obtained in the case in which the solid-state imaging device 5 (5A to 5D) of each configuration example is used in the shape measurement apparatus 1 will be described with reference to FIG. 7 to FIG. 10. Each of FIG. 7 to FIG. 9 is a diagram illustrating an example of the intensity distribution of the line-shaped light, in grayscale, incident on the first light receiving unit 10 and the like of the solid-state imaging device 5A (FIG. 2) according to the first configuration example. FIG. 10 is a diagram illustrating an example of the intensity distribution of the line-shaped light, in grayscale, incident on the first light receiving unit 10 and the like of the solid-state imaging device 5D (FIG. 6) according to the fourth configuration example.

In the example illustrated in FIG. 7, in the first light receiving unit 10 and the second light receiving units 20A and 20B, the light L is incident on a region extending in a direction parallel to the x direction and having a narrow width in the y direction. This shows the state in which the optical setting of the light irradiation unit 3, the imaging optical system 4, and the solid-state imaging device 5 is appropriate in the shape measurement apparatus 1.

In this case, the second electrical signal output from each of the second signal processing units 40A and 40B indicates that the light intensity peak position in the y direction is equal to each other and the width of the distribution is narrow in the light incident intensity distribution in the y direction in each of the second light receiving units 20A and 20B.

That is, based on the second electrical signal output from each of the second signal processing units 40A and 40B, it is possible to detect the state in which the light L is incident on the region extending in the direction parallel to the x direction and having the narrow width in the y direction in the first light receiving unit 10. In addition, it is possible to detect the state in which the optical setting of the light irradiation unit 3, the imaging optical system 4, and the solid-state imaging device 5 is appropriate in the shape measurement apparatus 1.

In the example illustrated in FIG. 8, in the first light receiving unit 10 and the second light receiving units 20A and 20B, the light L is incident on a region extending in a direction parallel to the x direction and having a wide width in the y direction. This shows the state in which the optical setting of the light irradiation unit 3 is not appropriate in the shape measurement apparatus 1 (the state in which a range having a wade width on the surface of the object 2 is irradiated with the light), or the state in which the optical setting of the imaging optical system 4 is not appropriate (the state in which the focus of the imaging is not appropriate).

In this case, the second electrical signal output from each of the second signal processing units 40A and 40B indicates that the light intensity peak position in the y direction is equal to each other and the width of the distribution is wide in the light incident intensity distribution in the y direction in each of the second light receiving units 20A and 20B.

That is, based on the second electrical signal output from each of the second signal processing units 40A and 40B, it is possible to detect the state in which the light L is incident on the region extending in the direction parallel to the x direction and having the wide width in the y direction in the first light receiving unit 10. In addition, it is possible to detect the state in which the optical setting of the light irradiation unit 3 or the imaging optical system 4 is not appropriate in the shape measurement apparatus 1.

In the example illustrated in FIG. 9, in the first light receiving unit 10 and the second light receiving units 20A and 20B, the light L is incident on a region extending in a direction inclined with respect to the x direction and having a narrow width in the y direction. This shows the state in which the optical setting of the light irradiation unit 3 is not appropriate in the shape measurement apparatus 1 (the state in which the line-shaped region ML inclined with respect to the direction D2 on the surface of the object 2 is irradiated with the light), or the state in which the optical setting of the solid-state imaging device 5 is not appropriate (the state in which the orientation around the optical axis is not appropriate).

In this case, the second electrical signal output from each of the second signal processing units 40A and 40B indicates that the light intensity peak position in the y direction is different from each other and the width of the distribution is narrow in the light incident intensity distribution in the y direction in each of the second light receiving units 20A and 20B.

That is, based on the second electrical signal output from each of the second signal processing units 40A and 40B, it is possible to detect the state in which the light L is incident on the region extending in the direction inclined with respect to the x direction and having the narrow width in the y direction in the first light receiving unit 10. In addition, it is possible to detect the state in which the optical setting of the light irradiation unit 3 or the solid-state imaging device 5 is not appropriate in the shape measurement apparatus 1.

In addition, the detection of the width in the y direction of the light incident on the first light receiving unit 10 can be performed not only in the solid-state imaging device 5A of the first configuration example (FIG. 2) but also in the solid-state imaging device 5B of the second configuration example (FIG. 4), the solid-state imaging device 5C of the third configuration example (FIG. 5), and the solid-state imaging device 5D of the fourth configuration example (FIG. 6). Further, the detection of the degree of inclination of the light incident on the first light receiving unit 10 can be performed not only in the solid-state imaging device 5A of the first configuration example (FIG. 2) but also in the solid-state imaging device 5D of the fourth configuration example (FIG. 6).

In the example illustrated in FIG. 10, in the first light receiving unit 10 and the second light receiving units 20A, 20B, and 20C, the light L is incident on a region extending in a direction inclined with respect to the x direction. As in the case illustrated in FIG. 9, this shows the state in which the optical setting of the light irradiation unit 3 is not appropriate (the state in which the line-shaped region ML inclined with respect to the direction D2 on the surface of the object 2 is irradiated with the light), or the state in which the optical setting of the solid-state imaging device 5 is not appropriate (the state in which the orientation around the optical axis is not appropriate).

Further, in this example, in the incident region of the light L, the width in the y direction is narrow in the vicinity of the center, and the width in the y direction is wide at both ends. This shows the state in which the optical setting of the imaging optical system 4 is appropriate (the focus of the imaging is appropriate) near the center of the incident region of the light L, and further, the optical setting of the imaging optical system 4 is not appropriate (the focus of the imaging is not appropriate) at both ends.

In the example illustrated in FIG. 10, the second electrical signal output from the second signal processing unit indicates that the light intensity peak position in the y direction is different from each other in the light incident intensity distribution in the y direction in each of the second light receiving units 20A, 20B, and 20C. Further, the second electrical signal output from the second signal processing unit indicates that the width of the light incident intensity distribution in the y direction in the second light receiving unit 20C provided at the center is narrow, and further, indicates that the width of the light incident intensity distribution in the y direction in each of the second light receiving units 20A and 20B provided at both ends is wide.

That is, based on the second electrical signal output from the second signal processing unit, it is possible to detect the state in which the light L is incident on the region extending in the direction inclined with respect to the x direction in the first light receiving unit 10, and further, it is possible to detect the state in which the focus is appropriate near the center but the focus is not appropriate at both ends. In addition, it is possible to detect the state in which the optical setting of the light irradiation unit 3, the imaging optical system 4, or the solid-state imaging device 5 is not appropriate in the shape measurement apparatus 1.

The operation unit 50 of the solid-state imaging device 5 (5A to 5D) obtains the light incident intensity distribution in the y direction in the second light receiving unit based on the second electrical signal output from the second signal processing unit. Further, the operation unit 50 can evaluate the optical setting state of the light irradiation unit 3, the imaging optical system 4, or the solid-state imaging device 5 based on the light incident intensity distribution in the y direction in the second light receiving unit, as described above with reference to FIG. 7 to FIG. 10 (evaluation step).

The adjustment unit 6 of the shape measurement apparatus 1 can adjust the optical setting state of the light irradiation unit 3, the imaging optical system 4, or the solid-state imaging device 5 based on the evaluation result by the operation unit 50 of the solid-state imaging device 5 (adjustment step). The optical setting state of the light irradiation unit 3 is, for example, a relative position or orientation with respect to the object 2, and a state of an optical system between the light source and the object 2. The optical setting state of the imaging optical system 4 is, for example, a focus adjustment state. The optical setting state of the solid-state imaging device 5 is, for example, a relative position or orientation with respect to the object 2.

Figure 11:
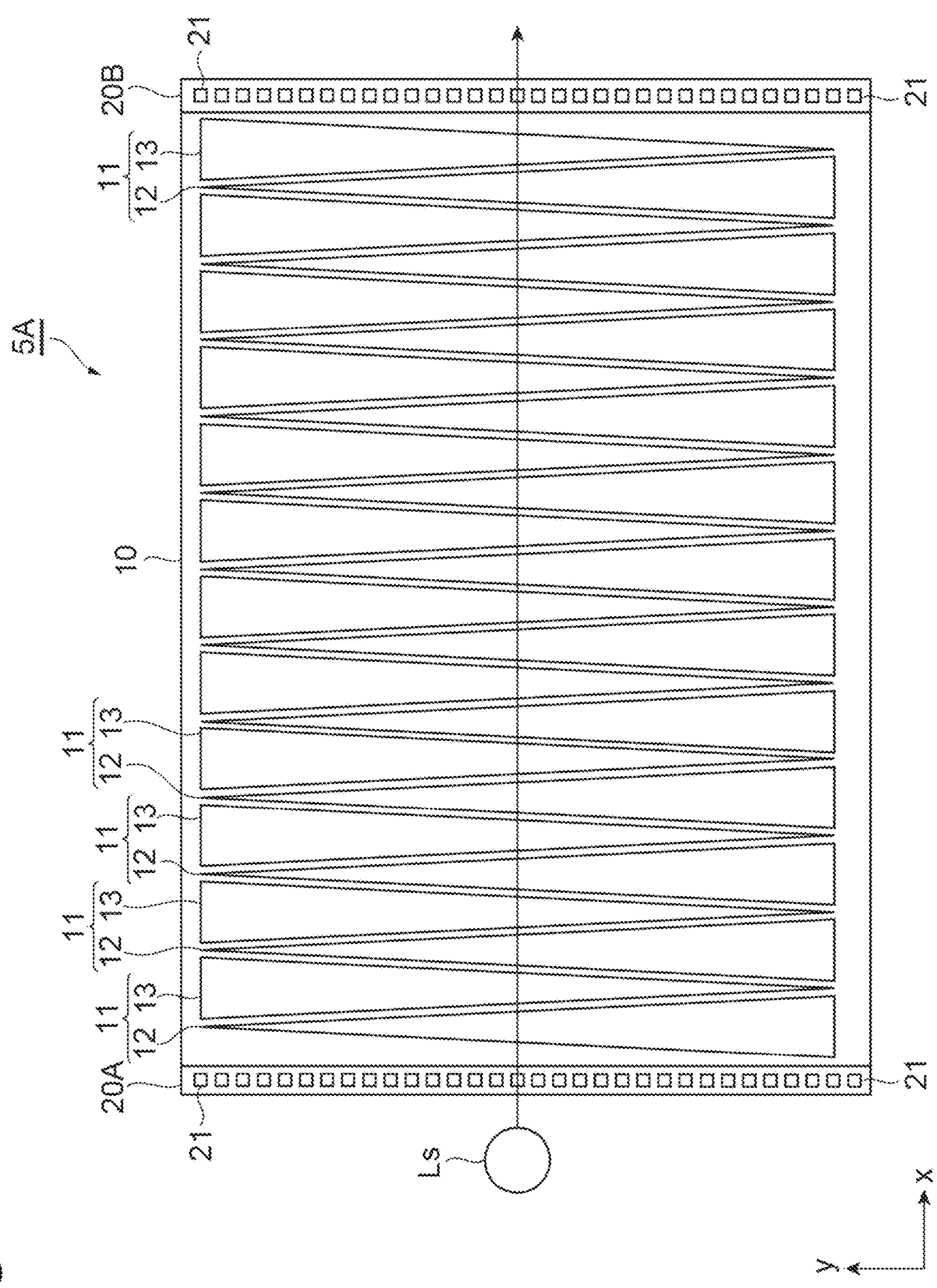
FIG. 11 is a diagram illustrating a method of correcting a light incident position in a y direction obtained based on a first electrical signal in the solid-state imaging device 5A (FIG. 2) of the first configuration example.

Next, a method of correcting the light incident position in the y direction obtained based on the first electrical signal in the solid-state imaging device 5 (5A to 5D) will be described with reference to FIG. 11. In the case in which the light incident position in the y direction obtained based on the first electrical signal is not accurate, it is preferable to obtain the true light incident position in the y direction by performing correction as described below. FIG. 11 is a diagram illustrating the method of correcting the light incident position in the y direction obtained based on the first electrical signal in the solid-state imaging device 5A (FIG. 2) of the first configuration example.

At the time of this correction, first, at each position in the y direction, the light is made incident on each position on a predetermined line extending in the x direction for the solid-state imaging device 5A. In this case, line-shaped light extending in the x direction may be incident at each position in the y direction, or an incident position of spot-shaped light Ls may be scanned along the x direction as illustrated in FIG. 11.

Based on the first signal output from the signal processing unit, the light incident position in the y direction is obtained at each position in the x direction in the first light receiving unit 10. Further, based on the second signal output from the signal processing unit, the light incident position in the y direction in each of the second light receiving units 20A and 20B is obtained. In addition, at each position in the y direction, the light incident position in the y direction obtained based on the first electrical signal is corrected based on the comparison between the light incident positions in the y direction respectively obtained based on the first electrical signal and the second electrical signal.

The storage unit 60 stores the correction formula for correcting the light incident position in the y direction obtained based on the first electrical signal. The correction formula is obtained for each position in the x direction. The correction formula is a conversion formula for converting the light incident position in the y direction obtained based on the first electrical signal into the light incident position in the y direction obtained based on the second electrical signal (the true light incident position in the y direction).

In the case in which the correction formula is represented by a certain function formula, the storage unit 60 may store coefficients of the function formula. Further, the storage unit 60 may be a lookup table. In this case, the light incident position in the y direction obtained based on the first electrical signal is set as an address of the lookup table, and the data at the above address is set as the true light incident position in the y direction.

When obtaining the light incident position in the y direction at each position in the x direction in the first light receiving unit 10 based on the first electrical signal, the operation unit 50 performs the correction based on the correction formula stored in the storage unit 60. Even in the case in which the light incident position in the y direction obtained based on the first electrical signal is not accurate, it is possible to obtain the accurate light incident position in the y direction by performing the correction described above.

The correction described above can be performed not only in the solid-state imaging device 5A of the first configuration example (FIG. 2) but also in the solid-state imaging device 5B of the second configuration example (FIG. 4), the solid-state imaging device 5C of the third configuration example (FIG. 5), and the solid-state imaging device 5D of the fourth configuration example (FIG. 6).

Figure 12:
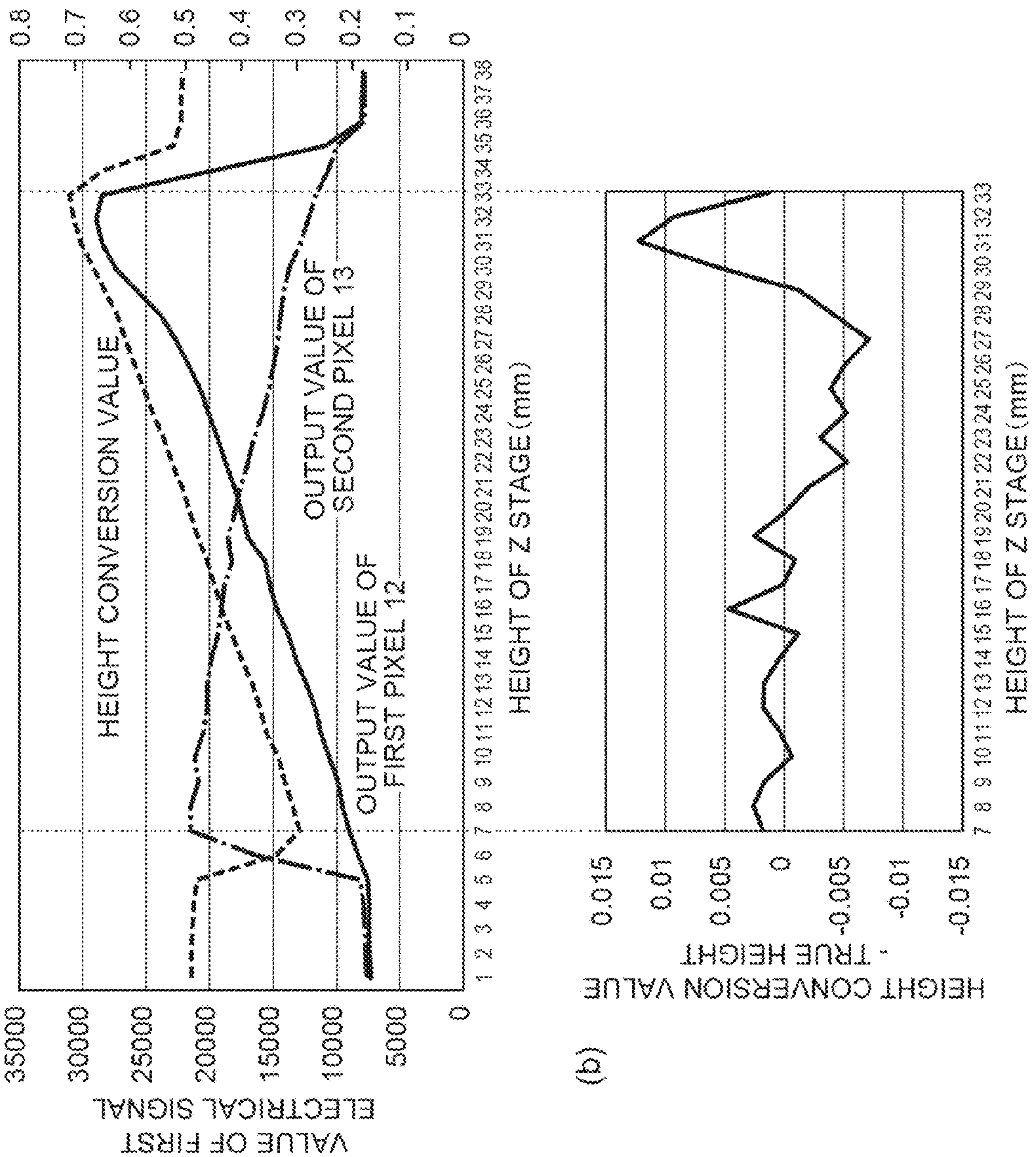
FIG. 12 includes (a) a graph showing, when a height of an object 2 is changed in the shape measurement apparatus 1, changes of a value of the first electrical signal in each of a first pixel 12 and a second pixel 13 of one certain pixel pair 11 of the first light receiving unit 10 of the solid-state imaging device 5 and a height conversion value of the object 2 obtained from the value of the first electrical signal, and (b) a graph showing a difference between the height conversion value of the object 2 obtained from the first electrical signal and a true height.

(a) in FIG. 12 is a graph showing, when the height of the object 2 is changed in the shape measurement apparatus 1, changes of the value of the first electrical signal in each of the first pixel 12 and the second pixel 13 of one certain pixel pair 11 of the first light receiving unit 10 of the solid-state imaging device 5 and a height conversion value of the object 2 obtained from the value of the first electrical signal. The horizontal axis in this graph indicates an actual height of the object 2 set by changing the height of the Z stage on which the object 2 is placed by 1 mm.

As shown in this graph, when the height of the object 2 is changed, the increase and the decrease of the value of the first electrical signal in each of the first pixel 12 and the second pixel 13 have opposite tendencies to each other. Thus, the data D12 of the first pixel 12 and the data D13 of the second pixel 13 may be obtained based on the first electrical signal, and the light incident position (height conversion value) in the y direction can be obtained based on the ratio of the two data D12 and D13.

(b) in FIG. 12 is a graph showing, when the height of the object 2 is changed in the shape measurement apparatus 1, a difference between the height conversion value of the object 2 obtained from the first electrical signal and the true height. This difference is 0 (or a very small value) in the ideal case, but is a significant value which is not 0 in the actual case. When there is the error described above, the measurement accuracy of the shape of the object 2 decreases. In addition, by performing the correction described above, the light incident position in the y direction in the first light receiving unit 10 can be accurately obtained, and the shape of the object 2 can be accurately measured.

Next, other configuration examples of the first pixel 12 and the second pixel 13 of each of the plurality of pixel pairs 11 of the first light receiving unit 10 will be described. When the line-shaped light extending in the x direction is incident on the first light receiving unit 10, as the light incident position moves from the one side to the other side in the y direction, the charge amount generated in the first pixel 12 gradually decreases, and the charge amount generated in the second pixel 13 gradually increases.

The first pixel 12 and the second pixel 13 having the relationship between the light incident position in the y direction and the charge generation amount described above may have various types of configurations. In the configuration example described in the above, the first pixel 12 and the second pixel 13 are characterized by the shape, and the shape is set to the isosceles triangular shape. The first pixel 12 and the second pixel 13 are not limited thereto, and may be set as configuration examples as illustrated in FIG. 13 to FIG. 22.

Figure 13:
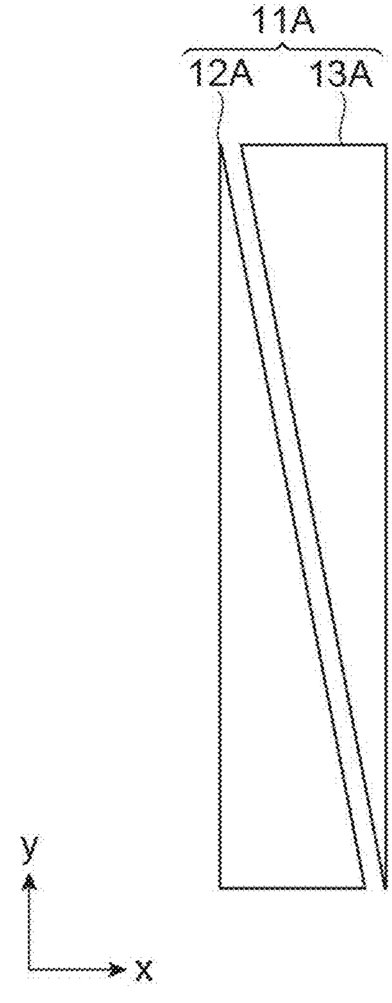
FIG. 13 is a diagram illustrating another configuration example of the pixel pair 11 including the first pixel 12 and the second pixel 13.

FIG. 13 is a diagram illustrating another configuration example of the pixel pair 11 including the first pixel 12 and the second pixel 13. Each pixel pair 11A of the configuration example illustrated in this diagram includes a first pixel 12A and a second pixel 13A.

The shape of the first pixel 12A is a right triangular shape in which the width in the x direction gradually decreases from the one side to the other side in the y direction, and the shape of the second pixel 13A is a right triangular shape in which the width in the x direction gradually increases from the one side to the other side in the y direction. In each of the pixel pairs 11A, the first pixel 12A and the second pixel 13A are arranged such that hypotenuses in three sides of the respective right triangular shapes face each other. The overall shape of each of the pixel pairs 11A may be set to a substantially rectangular shape.

Figure 14:
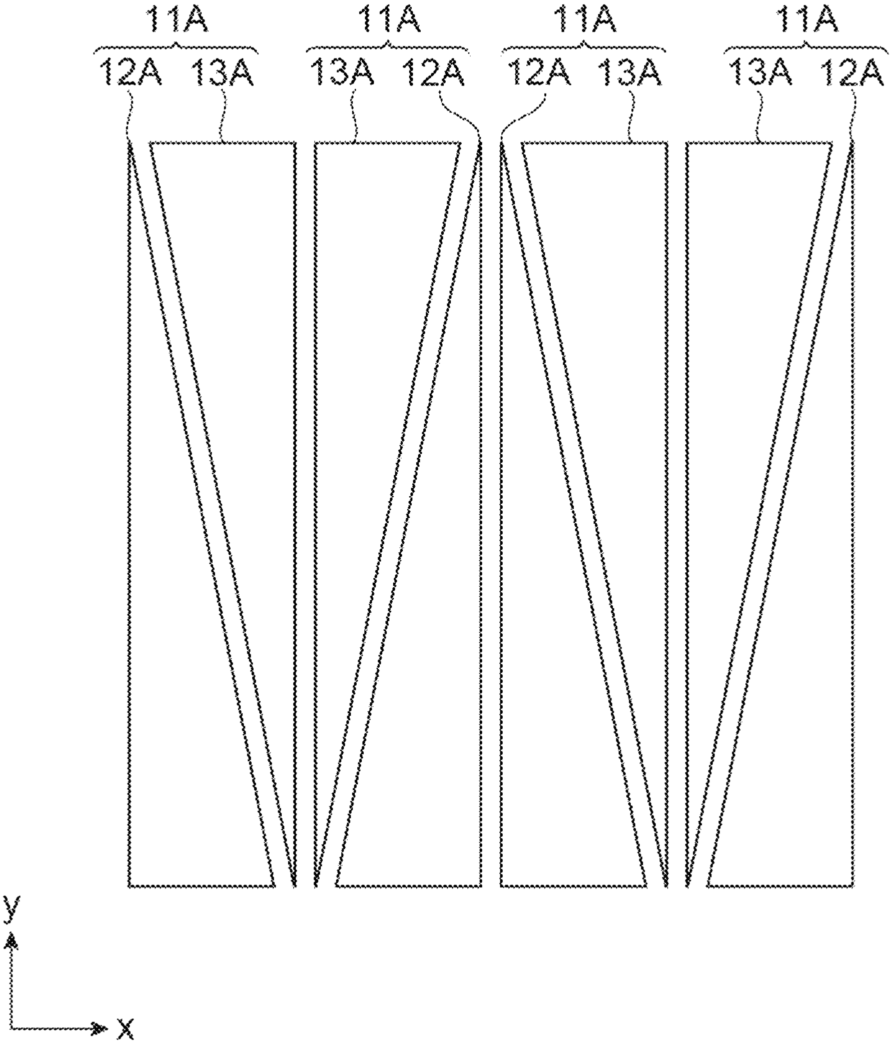
FIG. 14 is a diagram illustrating an example in which a plurality of pixel pairs 11A are arrayed along an x direction in the first light receiving unit 10.

In the configuration example illustrated in FIG. 13, in the first light receiving unit 10 in which the plurality of pixel pairs 11A are arrayed along the x direction, the first pixels 12A and the second pixels 13A may be alternately arrayed, or may be arrayed as illustrated in FIG. 14. In the array illustrated in FIG. 14, the first pixel 12A of the one certain pixel pair 11A and the first pixel 12A of the adjacent pixel pair 11A have sides parallel to the y direction in three sides of the respective right triangular shapes facing each other, and further, the second pixel 13A of the one certain pixel pair 11A and the second pixel 13A of the adjacent pixel pair 11A have sides parallel to the y direction in three sides of the respective right triangular shapes facing each other.

Figure 15:
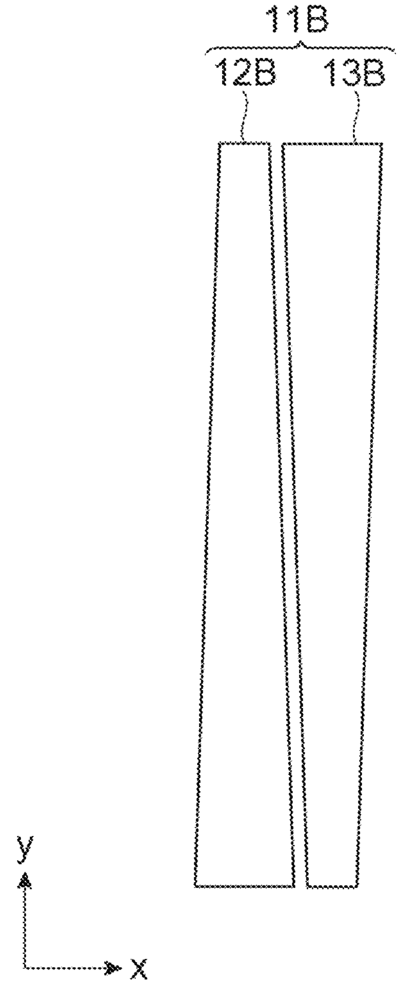
FIG. 15 is a diagram illustrating still another configuration example of the pixel pair 11 including the first pixel 12 and the second pixel 13.

FIG. 15 is a diagram illustrating still another configuration example of the pixel pair 11 including the first pixel 12 and the second pixel 13. Each pixel pair 11B of the configuration example illustrated in this diagram includes a first pixel 12B and a second pixel 13B.

The shape of the first pixel 12B is a trapezoidal shape in which the width in the x direction gradually decreases from the one side to the other side in the y direction, and the shape of the second pixel 13B is a trapezoidal shape in which the width in the x direction gradually increases from the one side to the other side in the y direction. The overall shape of each of the pixel pairs 11B may be a substantially parallelogram shape as illustrated in this diagram, or may be a substantially rectangular shape.

Figure 16:
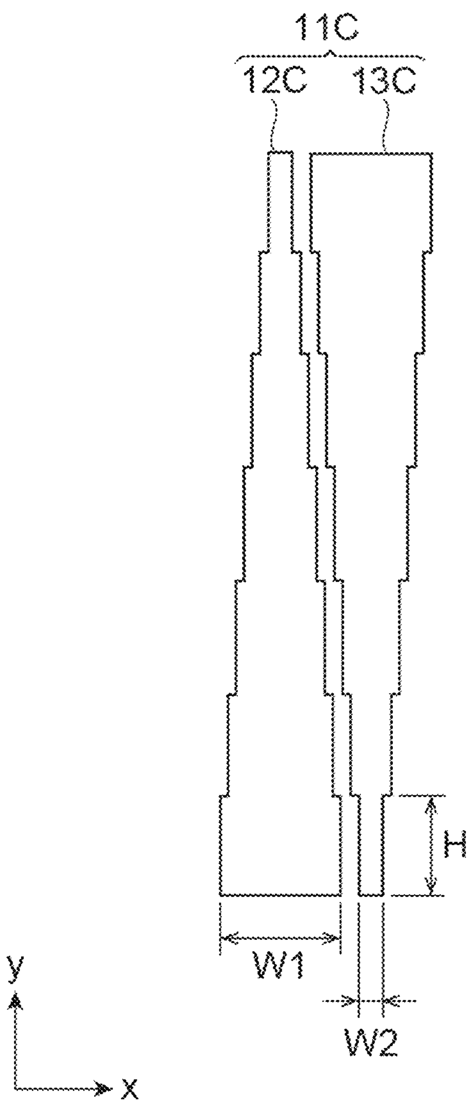
FIG. 16 is a diagram illustrating still another configuration example of the pixel pair 11 including the first pixel 12 and the second pixel 13.

FIG. 16 is a diagram illustrating still another configuration example of the pixel pair 11 including the first pixel 12 and the second pixel 13. In the configuration examples described in the above, in each of the first pixel 12 and the second pixel 13, the width in the x direction continuously changes from the one side to the other side in the y direction. On the other hand, each pixel pair 11C of the configuration example illustrated in this diagram includes a first pixel 12C and a second pixel 13C.

The shape of the first pixel 12C is a shape in which the width in the x direction decreases stepwise from the one side to the other side in the y direction, and the shape of the second pixel 13C is a shape in which the width in the x direction increases stepwise from the one side to the other side in the y direction.

For example, in each of the first pixel 12C and the second pixel 13C, a maximum width W1 in the x direction is set to about 10 μm, a minimum width W2 in the x direction is set to 1 μm or less, a length in the y direction is set to several mm, and the width in the x direction increases or decreases stepwise by a constant value (for example, 0.05 μm to 0.10 μm) for each constant interval H (for example, 10 μm to 20 μm) in the y direction.

The width in the y direction of the line-shaped light or the diameter of the spot-shaped light incident on the first light receiving unit 10 in which the plurality of pixel pairs 11C are arrayed along the x direction is set to, for example, about 20 μm so as to be larger than the interval H in the y direction in which the width in the x direction changes in each of the first pixel 12C and the second pixel 13C.

Figure 17:
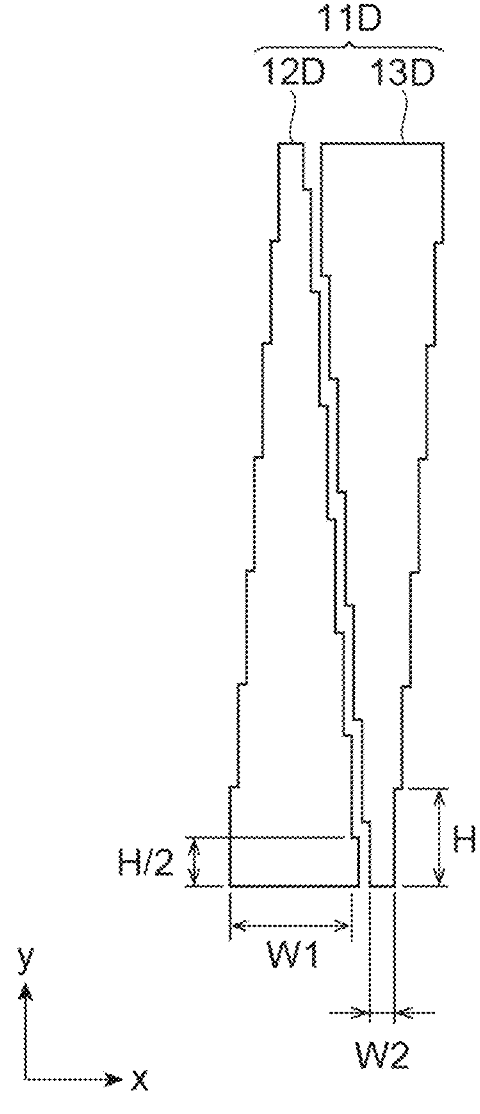
FIG. 17 is a diagram illustrating still another configuration example of the pixel pair 11 including the first pixel 12 and the second pixel 13.

FIG. 17 is a diagram illustrating still another configuration example of the pixel pair 11 including the first pixel 12 and the second pixel 13. Each pixel pair 11D of the configuration example illustrated in this diagram includes a first pixel 12D and a second pixel 13D.

The shape of the first pixel 12D is a shape in which the width in the x direction decreases stepwise from the one side to the other side in the y direction, and the shape of the second pixel 13D is a shape in which the width in the x direction increases stepwise from the one side to the other side in the y direction. In this case, the y direction position of the line-shaped light or the spot-shaped light incident on the first light receiving unit 10 is detected by the signal change of each pixel pair, and therefore, the detection resolution can be improved by changing the step position in the y direction in each of the first pixel 12D and the second pixel 13D.

For example, in each of the first pixel 12D and the second pixel 13D, the maximum width W1 in the x direction is set to about 10 μm, the minimum width W2 in the x direction is set to 1 μm or less, the length in the y direction is set to several mm, and the width in the x direction increases or decreases stepwise by the constant value (for example, 0.05 μm to 0.10 μm) for each constant interval H (for example, 10 μm to 20 μm) in the y direction.

In this case, in each pixel, the step position of the one side in the x direction is moved in the y direction by H/2 with respect to the step position of the other side. The width in the y direction of the line-shaped light or the diameter of the spot-shaped light incident on the first light receiving unit 10 in which the plurality of pixel pairs 11D are arrayed along the x direction is set to, for example, about 10 μm so as to be larger than the interval H in the y direction in which the width in the x direction changes in each of the first pixel 12D and the second pixel 13D.

Figure 18:
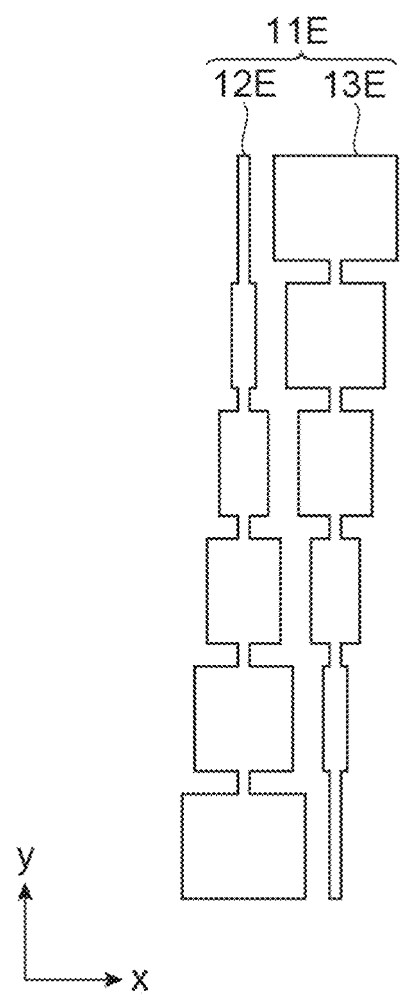
FIG. 18 is a diagram illustrating still another configuration example of the pixel pair 11 including the first pixel 12 and the second pixel 13.

FIG. 18 is a diagram illustrating still another configuration example of the pixel pair 11 including the first pixel 12 and the second pixel 13. Each pixel pair 11E of the configuration example illustrated in this diagram includes a first pixel 12E and a second pixel 13E.

The shape of the first pixel 12E is a shape in which the width in the x direction gradually decreases from the one side to the other side in the y direction while the width repeatedly decreases and increases, and the shape of the second pixel 13E is a shape in which the width in the x direction gradually increases from the one side to the other side in the y direction while the width repeatedly increases and decreases. The shape of each of the first pixel 12E and the second pixel 13E may be a shape obtained by sequentially combining a plurality of quadrangular shapes arranged along the y direction.

Figure 19:
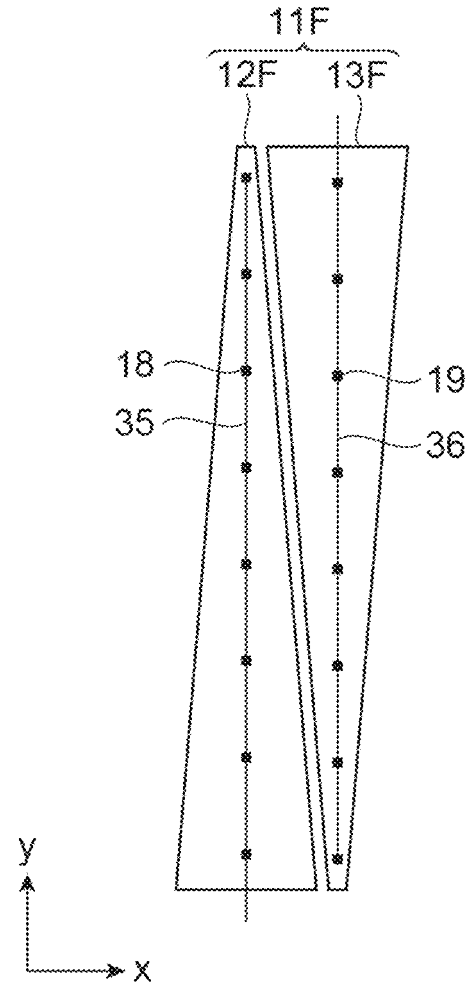
FIG. 19 is a diagram illustrating still another configuration example of the pixel pair 11 including the first pixel 12 and the second pixel 13.

FIG. 19 is a diagram illustrating still another configuration example of the pixel pair 11 including the first pixel 12 and the second pixel 13. Each pixel pair 11F of the configuration example illustrated in this diagram includes a first pixel 12F and a second pixel 13F.

The first pixel 12F is electrically connected to a wiring line 35 via a plurality of contacts 18 discretely provided along the y direction, and is electrically connected to the first signal processing unit 30 via the plurality of contacts 18 and the wiring line 35. The second pixel 13F is electrically connected to a wiring line 36 via a plurality of contacts 19 discretely provided along the y direction, and is electrically connected to the first signal processing unit 30 via the plurality of contacts 19 and the wiring line 36.

In the configuration example illustrated in FIG. 19, an impedance between the first pixel 12F and the first signal processing unit 30 can be reduced, and even in the case of the charges generated at a portion far from the first signal processing unit 30 in the first pixel 12F, a time for the charges to reach the first signal processing unit 30 can be reduced, and thus, a charge readout speed can be improved. The same applies to the second pixel 13F.

The width in the x direction of each of the wiring lines 35 and 36 may be narrowed to the extent that the light receiving of each of the first pixel 12F and the second pixel 13F is not affected. Further, in the case in which the light incident on the first light receiving unit 10 and the like is incident from the rear surface opposite to the front surface of the semiconductor substrate on which these are formed, the wiring line does not block the light incidence.

In the configuration examples described in the above, the first pixel 12 and the second pixel 13 of each pixel pair 11 are characterized by the shape. In the configuration examples described below, each pixel pair 11 further includes a light transmission filter or a light shielding film in addition to the first pixel 12 and the second pixel 13.

Figure 20:
FIG. 20 includes (a) a plan view and (b) a cross-sectional view illustrating still another configuration example of the pixel pair 11 including the first pixel 12 and the second pixel 13.
Figure 20:
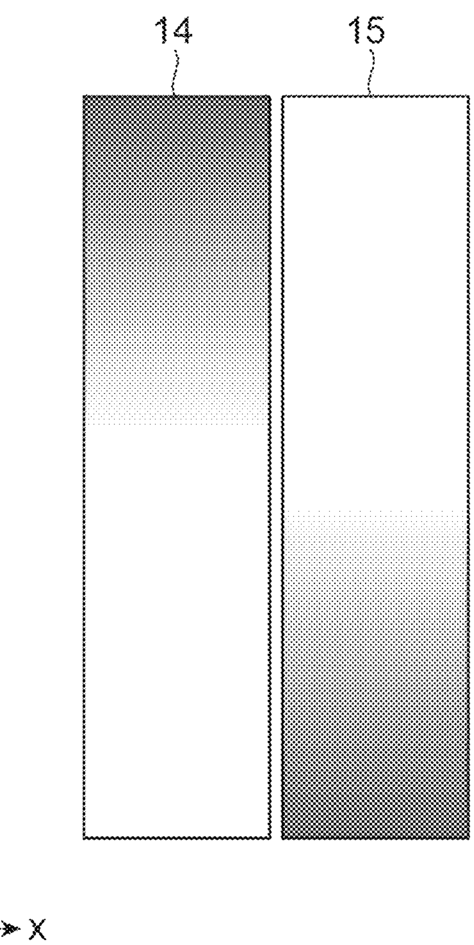

FIG. 20 is a diagram illustrating still another configuration example of the pixel pair 11 including the first pixel 12 and the second pixel 13. (a) in FIG. 20 is a plan view, and (b) in FIG. 20 is a cross-sectional view. Each pixel pair 11G of the configuration example illustrated in this diagram further includes a first filter 14 and a second filter 15 in addition to a first pixel 12G and a second pixel 13G.

The shape of each of the first pixel 12G and the second pixel 13G may be a rectangular shape having four sides parallel to the x direction or the y direction. The first filter 14 is provided so as to cover the entire region of the first pixel 12G, and attenuates the intensity of the light incident on the first pixel 12G according to the light transmittance. The second filter 15 is provided so as to cover the entire region of the second pixel 13G, and attenuates the intensity of the light incident on the second pixel 13G according to the light transmittance.

In the configuration example illustrated in FIG. 20, from the one side to the other side in the y direction, the light transmittance of the first filter 14 gradually decreases, and the light transmittance of the second filter 15 gradually increases. (a) in FIG. 20 illustrates the magnitude of the light transmittance of each of the first filter 14 and the second filter 15 in grayscale.

When the line-shaped light extending in the x direction is incident on the first light receiving unit 10, as the light incident position varies from the one side to the other side in the y direction, the light transmittance of the first filter 14 gradually decreases and thus the charge amount generated in the first pixel 12G gradually decreases, and on the other hand, the light transmittance of the second filter 15 gradually increases and thus the charge amount generated in the second pixel 13G gradually increases.

Figure 21:
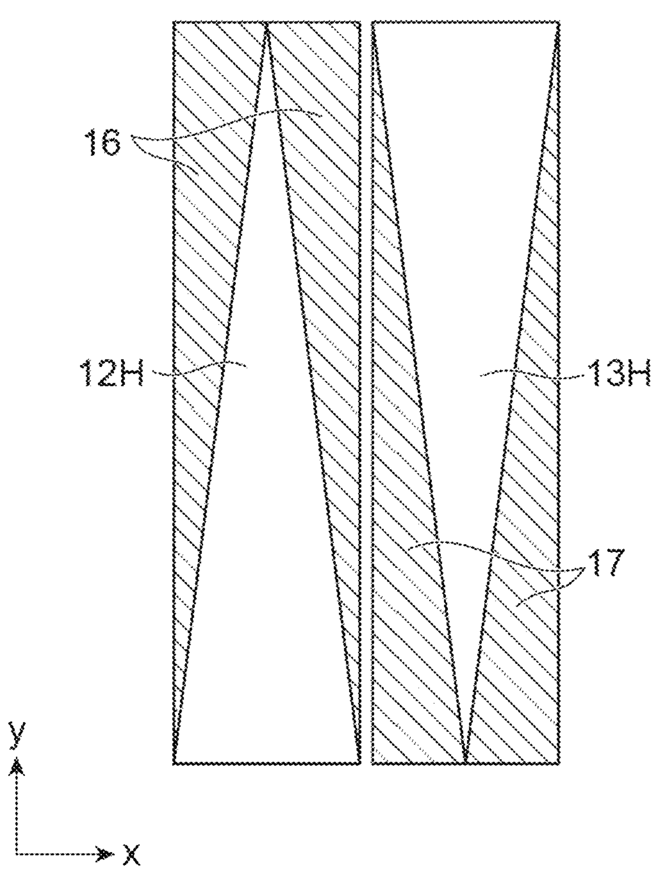
FIG. 21 includes (a) a plan view and (b) a cross-sectional view illustrating still another configuration example of the pixel pair 11 including the first pixel 12 and the second pixel 13.
Figure 21:
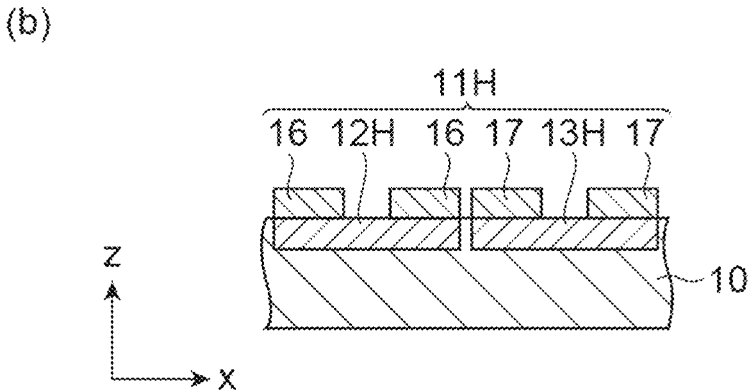

FIG. 21 is a diagram illustrating still another configuration example of the pixel pair 11 including the first pixel 12 and the second pixel 13. (a) in FIG. 21 is a plan view, and (b) in FIG. 21 is a cross-sectional view. Each pixel pair 11H of the configuration example illustrated in this diagram further includes a first light shielding film 16 and a second light shielding film 17 in addition to a first pixel 12H and a second pixel 13H.

The shape of each of the first pixel 12H and the second pixel 13H may be a rectangular shape having four sides parallel to the x direction or the y direction. The first light shielding film 16 is provided to cover a part of the first pixel 12H, and limits the light incidence onto the part of the first pixel 12H. The second light shielding film 17 is provided to cover a part of the second pixel 13H, and limits the light incidence onto the part of the second pixel 13H.

In the configuration example illustrated in FIG. 21, from the one side to the other side in the y direction, the width in the x direction of a part of the first pixel 12H which is not covered with the first light shielding film 16 gradually decreases, and the width in the x direction of a part of the second pixel 13H which is not covered with the second light shielding film 17 gradually increases.

In the example illustrated in this diagram, the shape of the part of the first pixel 12H not covered with the first light shielding film 16 is an isosceles triangular shape in which the width in the x direction gradually decreases from the one side to the other side in the y direction, and the shape of the part of the second pixel 13H not covered with the second light shielding film 17 is an isosceles triangular shape in which the width in the x direction gradually increases from the one side to the other side in the y direction.

In this configuration example also, when the line-shaped light extending in the x direction is incident on the first light receiving unit 10, as the light incident position varies from the one side to the other side in the y direction, the charge amount generated in the first pixel 12H gradually decreases, and the charge amount generated in the second pixel 13H gradually increases.

Figure 22:
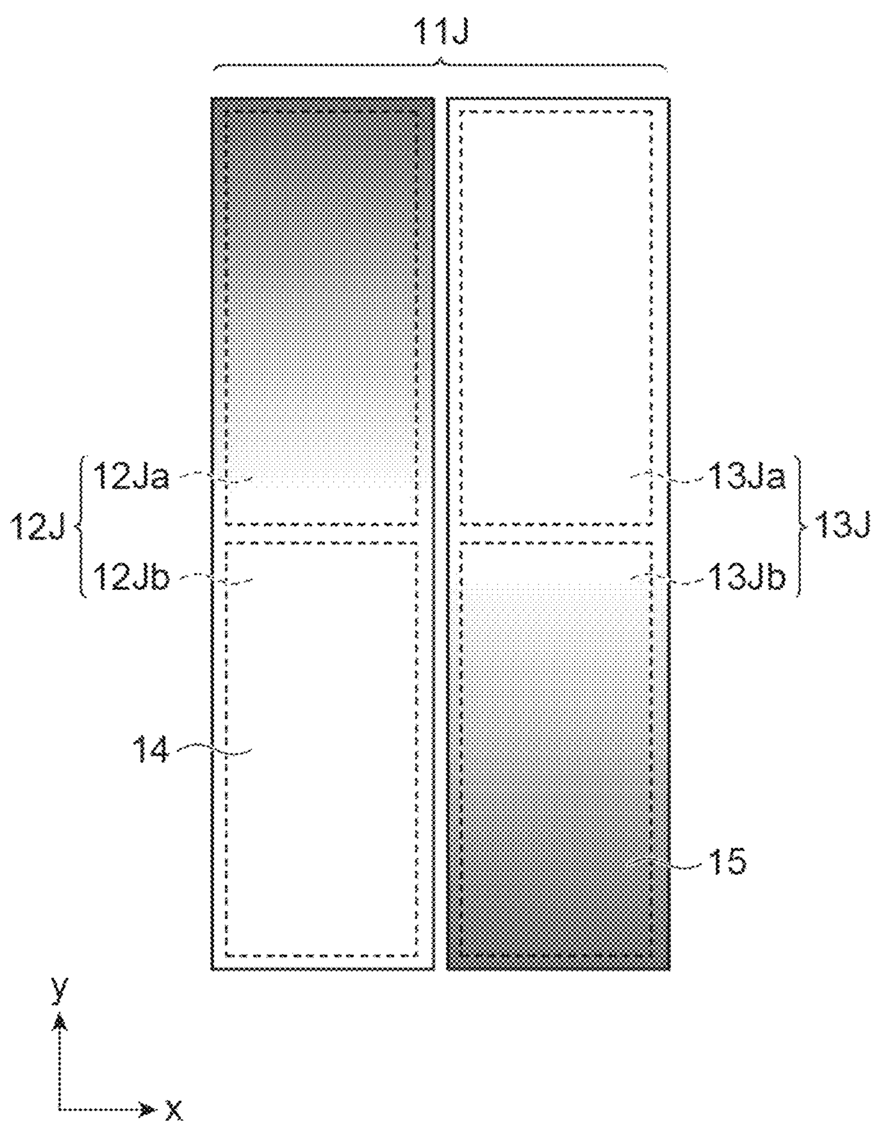
FIG. 22 is a diagram illustrating still another configuration example of the pixel pair 11 including the first pixel 12 and the second pixel 13.

FIG. 22 is a diagram illustrating still another configuration example of the pixel pair 11 including the first pixel 12 and the second pixel 13. Each pixel pair 11J of the configuration example illustrated in this diagram further includes the first filter 14 and the second filter 15 in addition to a first pixel 12J and a second pixel 13J.

As compared with the configuration example illustrated in FIG. 20, the configuration example illustrated in FIG. 22 is different in that each of the first pixel 12J and the second pixel 13J is divided into two regions. The first pixel 12J is divided into a first region 12Ja on the one side and a second region 12Jb on the other side in the y direction. The second pixel 13J is divided into a first region 13Ja on the one side and a second region 13Jb on the other side in the y direction.

In the configuration example illustrated in FIG. 22, the first signal processing unit for reading out the signal from each pixel of the first light receiving unit 10 preferably includes a first circuit provided on the one side in the y direction with respect to the first light receiving unit 10, a second circuit provided on the other side in the y direction with respect to the first light receiving unit 10, and an adder circuit for adding the data for the same pixel (the first pixel 12J or the second pixel 13J) out of the signals respectively output from the first circuit and the second circuit.

The first circuit reads out the signals respectively from the first region 12Ja of the first pixel 12J and the first region 13Ja of the second pixel 13J of each pixel pair 11J. The second circuit reads out the signals respectively from the second region 12Jb of the first pixel 12J and the second region 13Jb of the second pixel 13J of each pixel pair 11J. The first electrical signal output from the adder circuit is a data sequence according to the charge amount generated in each of the first pixel 12J and the second pixel 13J of each of the plurality of pixel pairs 11J.

In the configuration example illustrated in FIG. 22, each of the first pixel 12J and the second pixel 13J is divided into the region of the one side and the region of the other side in the y direction, and thus, a signal line between the first region 12Ja of the first pixel 12J and the first region 13Ja of the second pixel 13J and the first circuit can be shortened, and further, a signal line between the second region 12Jb of the first pixel 12J and the second region 13Jb of the second pixel 13J and the second circuit can be shortened.

The solid-state imaging device, the shape measurement apparatus, and the shape measurement method are not limited to the embodiments and configuration examples described above, and various modifications are possible. For example, two or more of the configuration examples described above may be combined.

The solid-state imaging device of the above embodiment includes a first light receiving unit in which a plurality of pixel pairs are arrayed along a first direction; and a second light receiving unit in which a plurality of pixels each for generating charges in an amount according to a light receiving amount are arrayed along a second direction intersecting with the first direction, and each of the plurality of pixel pairs of the first light receiving unit includes a first pixel and a second pixel arranged in juxtaposition along the first direction, and when line-shaped light extending in the first direction is incident on the first light receiving unit, as a light incident position varies from one side to another side in the second direction, a charge amount generated in the first pixel gradually decreases, and a charge amount generated in the second pixel gradually increases.

In the above solid-state imaging device, the second light receiving unit may be provided on one side in the first direction with respect to the first light receiving unit. Further, the second light receiving unit may be provided on both sides in the first direction with respect to the first light receiving unit.

In the above solid-state imaging device, the first light receiving unit may be divided into a first region of one side and a second region of another side in the first direction, and the second light receiving unit may be provided between the first region and the second region.

In the above solid-state imaging device, from the one side to the another side in the second direction, a width in the first direction of the first pixel may gradually decrease, and a width in the first direction of the second pixel may gradually increase.

In the above solid-state imaging device, each of the plurality of pixel pairs of the first light receiving unit may include a first filter provided to cover the first pixel, and a second filter provided to cover the second pixel, and from the one side to the another side in the second direction, a light transmittance of the first filter may gradually decrease, and a light transmittance of the second filter may gradually increase.

In the above solid-state imaging device, each of the plurality of pixel pairs of the first light receiving unit may include a first light shielding film provided to cover a part of the first pixel, and a second light shielding film provided to cover a part of the second pixel, and from the one side to the another side in the second direction, a width in the first direction of a part of the first pixel not covered with the first light shielding film may gradually decrease, and a width in the first direction of a part of the second pixel not covered with the second light shielding film may gradually increase.

The above solid-state imaging device may further include a signal processing unit for outputting a first electrical signal of a data sequence according to the charge amount generated in each of the first pixel and the second pixel of the plurality of pixel pairs of the first light receiving unit, and outputting a second electrical signal of a data sequence according to the charge amount generated in each of the plurality of pixels of the second light receiving unit.

The above solid-state imaging device may further include an operation unit for obtaining the light incident position in the second direction at each position in the first direction in the first light receiving unit based on the first electrical signal, and obtaining a light incident intensity distribution in the second direction in the second light receiving unit based on the second electrical signal.

The above solid-state imaging device may further include a storage unit for storing a correction formula for correcting the light incident position in the second direction obtained based on the first electrical signal, and the operation unit may perform correction based on the correction formula stored in the storage unit when obtaining the light incident position in the second direction at each position in the first direction in the first light receiving unit based on the first electrical signal.

The shape measurement apparatus of the above embodiment is an apparatus for measuring a shape of an object by a light section method, and includes a light irradiation unit for irradiating each position on a predetermined line on the object with light; an imaging optical system for inputting and forming an image of reflected light generated by light irradiation on the object by the light irradiation unit; and the solid-state imaging device of the above configuration for receiving the reflected light through the imaging optical system, and the operation unit of the solid-state imaging device measures the shape of the object by obtaining the light incident position in the second direction at each position in the first direction in the first light receiving unit based on the first electrical signal output from the signal processing unit of the solid-state imaging device, and evaluates an optical setting state of the light irradiation unit, the imaging optical system, or the solid-state imaging device by obtaining the light incident intensity distribution in the second direction in the second light receiving unit based on the second electrical signal output from the signal processing unit of the solid-state imaging device.

The above shape measurement apparatus may further include an adjustment unit for adjusting the optical setting state of the light irradiation unit, the imaging optical system, or the solid-state imaging device based on an evaluation result by the operation unit.

The shape measurement method of the above embodiment is a method for measuring a shape of an object by a light section method using a light irradiation unit for irradiating each position on a predetermined line on the object with light; an imaging optical system for inputting and forming an image of reflected light generated by light irradiation on the object by the light irradiation unit; and the solid-state imaging device of the above configuration for receiving the reflected light through the imaging optical system, and includes a measurement step of measuring the shape of the object by obtaining the light incident position in the second direction at each position in the first direction in the first light receiving unit based on the first electrical signal output from the signal processing unit of the solid-state imaging device; and an evaluation step of evaluating an optical setting state of the light irradiation unit, the imaging optical system, or the solid-state imaging device by obtaining the light incident intensity distribution in the second direction in the second light receiving unit based on the second electrical signal output from the signal processing unit of the solid-state imaging device.

The above shape measurement method may further include an adjustment step of adjusting the optical setting state of the light irradiation unit, the imaging optical system, or the solid-state imaging device based on an evaluation result in the evaluation step.

The correction method of the above embodiment includes causing light to be incident on each position on a predetermined line extending in the first direction for the solid-state imaging device of the above configuration at each position in the second direction; and correcting the light incident position in the second direction obtained based on the first electrical signal based on a comparison between the light incident positions in the second direction respectively obtained based on the first electrical signal and the second electrical signal output from the signal processing unit of the solid-state imaging device.

INDUSTRIAL APPLICABILITY

The embodiments can be used as a solid-state imaging device capable of performing evaluation and adjustment of an optical setting state when used for a shape measurement by a light section method. Further, the embodiments can be used as an apparatus and a method capable of measuring a shape of an object at high speed and high resolution by the light section method using the above solid-state imaging device.

REFERENCE SIGNS LIST

1—shape measurement apparatus, 2—object, 3—light irradiation unit, 4—imaging optical system, 5, 5A-5D—solid-state imaging device, 6—adjustment unit, 10—first light receiving unit, 10A—first region, 10B—second region, 11, 11A-11J—pixel pair, 12, 12A-12J—first pixel, 13, 13A-13J—second pixel, 14—first filter, 15—second filter, 16—first light shielding film, 17—second light shielding film, 20A, 20B, 20C—second light receiving unit, 21—pixel, 30—first signal processing unit, 31—NMOS transistor, 32—shift register, 33—charge amplifier, 34—AD converter circuit, 40A, 40B—second signal processing unit, 50—operation unit, 60—storage unit.

The invention claimed is:

1. A solid-state imaging device comprising:

a first light receiving unit in which a plurality of pixel pairs are arrayed along a first direction; and a second light receiving unit in which a plurality of pixels each configured to generate charges in an amount according to a light receiving amount are arrayed along a second direction intersecting with the first direction, wherein each of the plurality of pixel pairs of the first light receiving unit includes a first pixel and a second pixel arranged in juxtaposition along the first direction, when line-shaped light extending in the first direction is incident on the first light receiving unit, as a light incident position varies from one side to another side in the second direction, a charge amount generated in the first pixel gradually decreases, and a charge amount generated in the second pixel gradually increases, and the second light receiving unit is provided on one side in the first direction with respect to the first light receiving unit.

2. The solid-state imaging device according to claim 1, wherein, from the one side to the another side in the second direction, a width in the first direction of the first pixel gradually decreases, and a width in the first direction of the second pixel gradually increases.

3. The solid-state imaging device according to claim 1, wherein each of the plurality of pixel pairs of the first light receiving unit includes a first filter provided to cover the first pixel, and a second filter provided to cover the second pixel, and from the one side to the another side in the second direction, a light transmittance of the first filter gradually decreases, and a light transmittance of the second filter gradually increases.

4. The solid-state imaging device according to claim 1, wherein each of the plurality of pixel pairs of the first light receiving unit includes a first light shielding film provided to cover a part of the first pixel, and a second light shielding film provided to cover a part of the second pixel, and from the one side to the another side in the second direction, a width in the first direction of a part of the first pixel not covered with the first light shielding film gradually decreases, and a width in the first direction of a part of the second pixel not covered with the second light shielding film gradually increases.

5. The solid-state imaging device according to claim 1, further comprising a signal processing unit configured to output a first electrical signal of a data sequence according to the charge amount generated in each of the first pixel and the second pixel of the plurality of pixel pairs of the first light receiving unit, and output a second electrical signal of a data sequence according to the charge amount generated in each of the plurality of pixels of the second light receiving unit.

6. The solid-state imaging device according to claim 5, further comprising an operation unit configured to obtain the light incident position in the second direction at each position in the first direction in the first light receiving unit based on the first electrical signal, and obtain a light incident intensity distribution in the second direction in the second light receiving unit based on the second electrical signal.

7. The solid-state imaging device according to claim 6, further comprising a storage unit configured to store a correction formula for correcting the light incident position in the second direction obtained based on the first electrical signal, and the operation unit is configured to perform correction based on the correction formula stored in the storage unit when obtaining the light incident position in the second direction at each position in the first direction in the first light receiving unit based on the first electrical signal.

8. A shape measurement apparatus for measuring a shape of an object by a light section method, the apparatus comprising:

a light irradiation unit configured to irradiate each position on a predetermined line on the object with light;

an imaging optical system configured to input and form an image of reflected light generated by light irradiation on the object by the light irradiation unit; and the solid-state imaging device according to claim 6 configured to receive the reflected light through the imaging optical system, wherein the operation unit of the solid-state imaging device is configured to measure the shape of the object by obtaining the light incident position in the second direction at each position in the first direction in the first light receiving unit based on the first electrical signal output from the signal processing unit of the solid-state imaging device, and evaluate an optical setting state of the light irradiation unit, the imaging optical system, or the solid-state imaging device by obtaining the light incident intensity distribution in the second direction in the second light receiving unit based on the second electrical signal output from the signal processing unit of the solid-state imaging device.

9. The shape measurement apparatus according to claim 8, further comprising an adjustment unit configured to adjust the optical setting state of the light irradiation unit, the imaging optical system, or the solid-state imaging device based on an evaluation result by the operation unit.

10. A shape measurement method for measuring a shape of an object by a light section method using:

a light irradiation unit configured to irradiate each position on a predetermined line on the object with light;

an imaging optical system configured to input and form an image of reflected light generated by light irradiation on the object by the light irradiation unit; and the solid-state imaging device according to claim 9 configured to receive the reflected light through the imaging optical system, wherein the method comprises:

performing a measurement of the shape of the object by obtaining the light incident position in the second direction at each position in the first direction in the first light receiving unit based on the first electrical signal output from the signal processing unit of the solid-state imaging device; and performing an evaluation of an optical setting state of the light irradiation unit, the imaging optical system, or the solid-state imaging device by obtaining the light incident intensity distribution in the second direction in the second light receiving unit based on the second electrical signal output from the signal processing unit of the solid-state imaging device.

11. The shape measurement method according to claim 10, further comprising performing an adjustment of the optical setting state of the light irradiation unit, the imaging optical system, or the solid-state imaging device based on an evaluation result in the evaluation.

12. A correction method comprising:

causing light to be incident on each position on a predetermined line extending in the first direction for the solid-state imaging device according to claim 5 at each position in the second direction; and correcting the light incident position in the second direction obtained based on the first electrical signal based on a comparison between the light incident positions in the second direction respectively obtained based on the first electrical signal and the second electrical signal output from the signal processing unit of the solid-state imaging device.

13. A solid-state imaging device comprising:

a first light receiving unit in which a plurality of pixel pairs are arrayed along a first direction; and a second light receiving unit in which a plurality of pixels each configured to generate charges in an amount according to a light receiving amount are arrayed along a second direction intersecting with the first direction, wherein each of the plurality of pixel pairs of the first light receiving unit includes a first pixel and a second pixel arranged in juxtaposition along the first direction, when line-shaped light extending in the first direction is incident on the first light receiving unit, as a light incident position varies from one side to another side in the second direction, a charge amount generated in the first pixel gradually decreases, and a charge amount generated in the second pixel gradually increases, and the second light receiving unit is provided on both sides in the first direction with respect to the first light receiving unit.

14. The solid-state imaging device according to claim 13, wherein, from the one side to the another side in the second direction, a width in the first direction of the first pixel gradually decreases, and a width in the first direction of the second pixel gradually increases.

15. The solid-state imaging device according to claim 13, wherein each of the plurality of pixel pairs of the first light receiving unit includes a first filter provided to cover the first pixel, and a second filter provided to cover the second pixel, and from the one side to the another side in the second direction, a light transmittance of the first filter gradually decreases, and a light transmittance of the second filter gradually increases.

16. The solid-state imaging device according to claim 13, wherein each of the plurality of pixel pairs of the first light receiving unit includes a first light shielding film provided to cover a part of the first pixel, and a second light shielding film provided to cover a part of the second pixel, and from the one side to the another side in the second direction, a width in the first direction of a part of the first pixel not covered with the first light shielding film gradually decreases, and a width in the first direction of a part of the second pixel not covered with the second light shielding film gradually increases.

17. The solid-state imaging device according to claim 13, further comprising a signal processing unit configured to output a first electrical signal of a data sequence according to the charge amount generated in each of the first pixel and the second pixel of the plurality of pixel pairs of the first light receiving unit, and output a second electrical signal of a data sequence according to the charge amount generated in each of the plurality of pixels of the second light receiving unit.

18. The solid-state imaging device according to claim 17, further comprising an operation unit configured to obtain the light incident position in the second direction at each position in the first direction in the first light receiving unit based on the first electrical signal, and obtain a light incident intensity distribution in the second direction in the second light receiving unit based on the second electrical signal.

19. The solid-state imaging device according to claim 18, further comprising a storage unit configured to store a correction formula for correcting the light incident position in the second direction obtained based on the first electrical signal, and the operation unit is configured to perform correction based on the correction formula stored in the storage unit when obtaining the light incident position in the second direction at each position in the first direction in the first light receiving unit based on the first electrical signal.

20. A shape measurement apparatus for measuring a shape of an object by a light section method, the apparatus comprising:

a light irradiation unit configured to irradiate each position on a predetermined line on the object with light;

an imaging optical system configured to input and form an image of reflected light generated by light irradiation on the object by the light irradiation unit; and the solid-state imaging device according to claim 18 configured to receive the reflected light through the imaging optical system, wherein the operation unit of the solid-state imaging device is configured to measure the shape of the object by obtaining the light incident position in the second direction at each position in the first direction in the first light receiving unit based on the first electrical signal output from the signal processing unit of the solid-state imaging device, and)

evaluate an optical setting state of the light irradiation unit, the imaging optical system, or the solid-state imaging device by obtaining the light incident intensity distribution in the second direction in the second light receiving unit based on the second electrical signal output from the signal processing unit of the solid-state imaging device.

21. The shape measurement apparatus according to claim 20, further comprising an adjustment unit configured to adjust the optical setting state of the light irradiation unit, the imaging optical system, or the solid-state imaging device based on an evaluation result by the operation unit.

22. A shape measurement method for measuring a shape of an object by a light section method using:

a light irradiation unit configured to irradiate each position on a predetermined line on the object with light;

an imaging optical system configured to input and form an image of reflected light generated by light irradiation on the object by the light irradiation unit; and the solid-state imaging device according to claim 20 configured to receive the reflected light through the imaging optical system, wherein the method comprises:

performing a measurement of the shape of the object by obtaining the light incident position in the second direction at each position in the first direction in the first light receiving unit based on the first electrical signal output from the signal processing unit of the solid-state imaging device; and performing an evaluation of an optical setting state of the light irradiation unit, the imaging optical system, or the solid-state imaging device by obtaining the light incident intensity distribution in the second direction in the second light receiving unit based on the second electrical signal output from the signal processing unit of the solid-state imaging device.

23. The shape measurement method according to claim 22, further comprising performing an adjustment of the optical setting state of the light irradiation unit, the imaging optical system, or the solid-state imaging device based on an evaluation result in the evaluation.

24. A correction method comprising:

causing light to be incident on each position on a predetermined line extending in the first direction for the solid-state imaging device according to claim 19 at each position in the second direction; and correcting the light incident position in the second direction obtained based on the first electrical signal based on a comparison between the light incident positions in the second direction respectively obtained based on the first electrical signal and the second electrical signal output from the signal processing unit of the solid-state imaging device.

25. A solid-state imaging device comprising:

a first light receiving unit in which a plurality of pixel pairs are arrayed along a first direction; and a second light receiving unit in which a plurality of pixels each configured to generate charges in an amount according to a light receiving amount are arrayed along a second direction intersecting with the first direction, wherein each of the plurality of pixel pairs of the first light receiving unit includes a first pixel and a second pixel arranged in juxtaposition along the first direction, when line-shaped light extending in the first direction is incident on the first light receiving unit, as a light incident position varies from one side to another side in the second direction, a charge amount generated in the first pixel gradually decreases, and a charge amount generated in the second pixel gradually increases, the first light receiving unit is divided into a first region of one side and a second region of another side in the first direction, and the second light receiving unit is provided between the first region and the second region.

26. The solid-state imaging device according to claim 25, wherein, from the one side to the another side in the second direction, a width in the first direction of the first pixel gradually decreases, and a width in the first direction of the second pixel gradually increases.

27. The solid-state imaging device according to claim 25, wherein each of the plurality of pixel pairs of the first light receiving unit includes a first filter provided to cover the first pixel, and a second filter provided to cover the second pixel, and from the one side to the another side in the second direction, a light transmittance of the first filter gradually decreases, and a light transmittance of the second filter gradually increases.

28. The solid-state imaging device according to claim 25, wherein each of the plurality of pixel pairs of the first light receiving unit includes a first light shielding film provided to cover a part of the first pixel, and a second light shielding film provided to cover a part of the second pixel, and from the one side to the another side in the second direction, a width in the first direction of a part of the first pixel not covered with the first light shielding film gradually decreases, and a width in the first direction of a part of the second pixel not covered with the second light shielding film gradually increases.

29. The solid-state imaging device according to claim 25, further comprising a signal processing unit configured to output a first electrical signal of a data sequence according to the charge amount generated in each of the first pixel and the second pixel of the plurality of pixel pairs of the first light receiving unit, and output a second electrical signal of a data sequence according to the charge amount generated in each of the plurality of pixels of the second light receiving unit.

30. The solid-state imaging device according to claim 29, further comprising an operation unit configured to obtain the light incident position in the second direction at each position in the first direction in the first light receiving unit based on the first electrical signal, and obtain a light incident intensity distribution in the second direction in the second light receiving unit based on the second electrical signal.

31. The solid-state imaging device according to claim 30, further comprising a storage unit configured to store a correction formula for correcting the light incident position in the second direction obtained based on the first electrical signal, and the operation unit is configured to perform correction based on the correction formula stored in the storage unit when obtaining the light incident position in the second direction at each position in the first direction in the first light receiving unit based on the first electrical signal.

32. A shape measurement apparatus for measuring a shape of an object by a light section method, the apparatus comprising:

a light irradiation unit configured to irradiate each position on a predetermined line on the object with light;

an imaging optical system configured to input and form an image of reflected light generated by light irradiation on the object by the light irradiation unit; and the solid-state imaging device according to claim 31 configured to receive the reflected light through the imaging optical system, wherein the operation unit of the solid-state imaging device is configured to measure the shape of the object by obtaining the light incident position in the second direction at each position in the first direction in the first light receiving unit based on the first electrical signal output from the signal processing unit of the solid-state imaging device, and evaluate an optical setting state of the light irradiation unit, the imaging optical system, or the solid-state imaging device by obtaining the light incident intensity distribution in the second direction in the second light receiving unit based on the second electrical signal output from the signal processing unit of the solid-state imaging device.

33. The shape measurement apparatus according to claim 32, further comprising an adjustment unit configured to adjust the optical setting state of the light irradiation unit, the imaging optical system, or the solid-state imaging device based on an evaluation result by the operation unit.

34. A shape measurement method for measuring a shape of an object by a light section method using:

a light irradiation unit configured to irradiate each position on a predetermined line on the object with light;

an imaging optical system configured to input and form an image of reflected light generated by light irradiation on the object by the light irradiation unit; and the solid-state imaging device according to claim 31 configured to receive the reflected light through the imaging optical system, wherein the method comprises:

performing a measurement of the shape of the object by obtaining the light incident position in the second direction at each position in the first direction in the first light receiving unit based on the first electrical signal output from the signal processing unit of the solid-state imaging device; and performing an evaluation of an optical setting state of the light irradiation unit, the imaging optical system, or the solid-state imaging device by obtaining the light incident intensity distribution in the second direction in the second light receiving unit based on the second electrical signal output from the signal processing unit of the solid-state imaging device.

35. The shape measurement method according to claim 34, further comprising performing an adjustment of the optical setting state of the light irradiation unit, the imaging optical system, or the solid-state imaging device based on an evaluation result in the evaluation.

36. A correction method comprising:

causing light to be incident on each position on a predetermined line extending in the first direction for the solid-state imaging device according to claim 29 at each position in the second direction; and correcting the light incident position in the second direction obtained based on the first electrical signal based on a comparison between the light incident positions in the second direction respectively obtained based on the first electrical signal and the second electrical signal output from the signal processing unit of the solid-state imaging device.

* * * * *